US012660604B1

(12) United States Patent
George et al.

(10) Patent No.: US 12,660,604 B1
(45) Date of Patent: Jun. 16, 2026

(54) TECHNOLOGIES FOR BACK SIDE STRUCTURES ON A QUANTUM PROCESSOR DIE

(71) Applicant: Intel Corporation, Santa Clara, CA (US)

(72) Inventors: Hubert C. George, Portland, OR (US); Roza Kotlyar, Camas, WA (US); Ravi Pillarisetty, Portland, OR (US); James S. Clarke, Portland, OR (US); Mohammad Islam, Portlance, OR (US); Stephanie Bojarski, Beaverton, OR (US); Andrew J. Wagner, Beaverton, OR (US); Eric Michael Henry, Forest Grove, OR (US); Fahd Ayyalil Mohiyaddin, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 432 days.

(21) Appl. No.: 18/344,455

(22) Filed: Jun. 29, 2023

(51) Int. Cl.
| | |
|---|---|
| *H10W 20/43* | (2026.01) |
| *H10D 62/81* | (2025.01) |
| *H10W 20/00* | (2026.01) |
| *H10W 20/44* | (2026.01) |

(52) U.S. Cl.
CPC .......... *H10W 20/43* (2026.01); *H10D 62/812* (2025.01); *H10W 20/01* (2026.01); *H10W 20/4484* (2026.01)

(58) Field of Classification Search
CPC ................ H01L 23/528; H01L 21/768; H01L 23/53285; H10D 62/812
See application file for complete search history.

(56) References Cited

U.S. PATENT DOCUMENTS

| | | | |
|---|---|---|---|
| 2005/0184285 A1* | 8/2005 | Friesen ................ | H10D 48/385 257/14 |
| 2009/0057652 A1* | 3/2009 | Nevirkovets ...... | H10N 60/0912 257/30 |
| 2019/0206991 A1* | 7/2019 | Pillarisetty ........... | H10D 48/383 |

(Continued)

OTHER PUBLICATIONS

Dargan, James. "Intel's Quantum Computing Technology: An Overview [2023]." The Quantum Insider, Apr. 26, 2023, https://thequantuminsider.com/2023/04/26/intels-quantum-computing-2023-2/.

(Continued)

*Primary Examiner* — Syed I Gheyas
(74) *Attorney, Agent, or Firm* — Alliance IP, LLC

(57) ABSTRACT

Technologies for backside structures on a quantum processor die are disclosed. In an illustrative embodiment, qubits are defined in a silicon layer of a semiconductor stack in a quantum processor die. Traces such as plunger gates, barrier gates, etc., can be positioned above and below the stack to interact with the qubits in various ways, such as by influencing a potential defining the qubits, shifting the resonance frequency of the qubits, causing oscillations in parameters such as physical position, electric field, magnetic field, etc. Static and/or dynamic voltages and/or currents may be applied to the traces, causing static and/or dynamic electric and/or magnetic fields to be applied to the qubits. The quantum processor die with such structure may be created using various techniques such as flip chip processing.

17 Claims, 29 Drawing Sheets

(56)     References Cited

U.S. PATENT DOCUMENTS

2021/0151405 A1     5/2021  Liao et al.
2024/0119333 A1*    4/2024  Katsaros ............. H10D 62/812

OTHER PUBLICATIONS

Li, Ruoyu, et al. "A Crossbar Network for Silicon Quantum Dot Qubits." Science Advances, vol. 4, No. 7, Jul. 2018, p. eaar3960. DOI.org (Crossref), https://doi.org/10.1126/sciadv.aar3960.
Pillarisetty, R., et al. "Si MOS and Si/SiGe Quantum Well Spin Qubit Platforms for Scalable Quantum Computing." 2021 IEEE International Electron Devices Meeting (IEDM), 2021, p. 14.1.1-14.1.4. IEEE Xplore, https://doi.org/10.1109/IEDM19574.2021.9720567.

* cited by examiner

200

700

702 — FORM SiGe-Si-SiGe STACK

704 — FORM DUMMY SILICON QUANTUM WELL

706 — DEPOSIT GATE OXIDE LAYER

708 — FORM QUBIT GATE LAYER

710 — FORM VIAS FROM TOP SIDE TOWARDS BACK SIDE

712 — FORM INTERCONNECT LAYER

714 — ATTACH CARRIER

716 — FLIP DIE

718 — GRIND CHIP

720 — GRIND TO DUMMY SILICON QUANTUM WELL

722 — PATTERN BACKSIDE

| | |
|---|---|
| 724 | ATTACH CARRIER |
| 726 | FLIP CHIP |
| 728 | GRIND CHIP |
| 730 | COMPLETE TOP SIDE |
| 732 | DICE WAFER |
| 734 | PACKAGE DIES |

FROM FIG. 7

302

418 416 414 412 410 904 902

424 426

302

2200

2202

2202

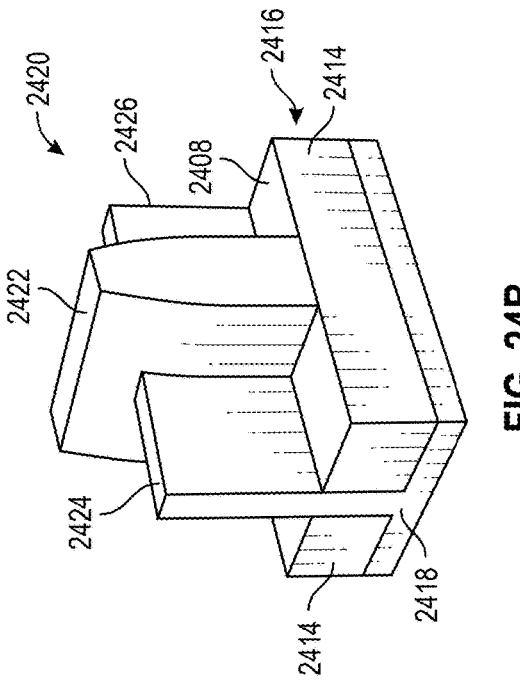
FIG. 24B
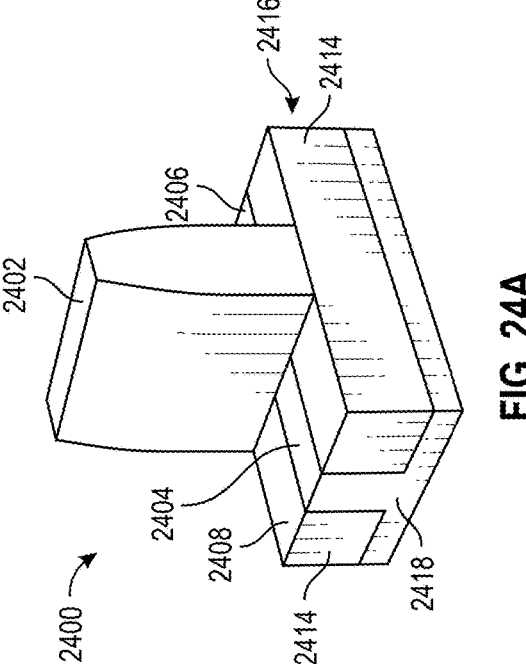
FIG. 24A
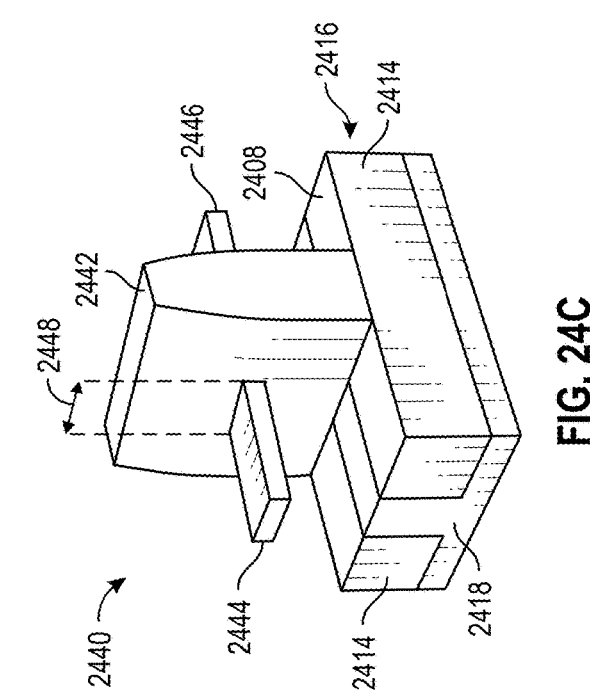
FIG. 24D
FIG. 24C

<u>2600</u>

| | |
|---|---|
| PROCESSOR UNIT <br> <u>2602</u> | COMMUNICATION COMPONENT <br> <u>2612</u> |
| MEMORY <br> <u>2604</u> | BATTERY/POWER <br> <u>2614</u> |
| DISPLAY DEVICE <br> <u>2606</u> | GNSS DEVICE <br> <u>2618</u> |
| AUDIO OUTPUT DEVICE <br> <u>2608</u> | AUDIO INPUT DEVICE <br> <u>2624</u> |
| AN OTHER OUTPUT DEVICE <br> <u>2610</u> | AN OTHER INPUT DEVICE <br> <u>2620</u> |

ANTENNA <u>2622</u>

FIG. 26

TECHNOLOGIES FOR BACK SIDE STRUCTURES ON A QUANTUM PROCESSOR DIE

BACKGROUND

Quantum computers promise computational abilities not feasible with classical computing. One of many challenges in semiconductor quantum computing is controlling the electric and magnetic fields experienced by spin qubits. Traces defined on top of the semiconductor stack in which the qubits are positioned can control the electric and magnetic fields experienced by the qubits by applying voltages and/or currents to various traces.

BRIEF DESCRIPTION OF THE DRAWINGS

FIGS. 24A-24D are perspective views of example planar, gate-all-around, and stacked gate-all-around transistors.

FIG. 26 is a block diagram of an example electrical device, in accordance with any of the embodiments disclosed herein.

DETAILED DESCRIPTION

Figure 1A:
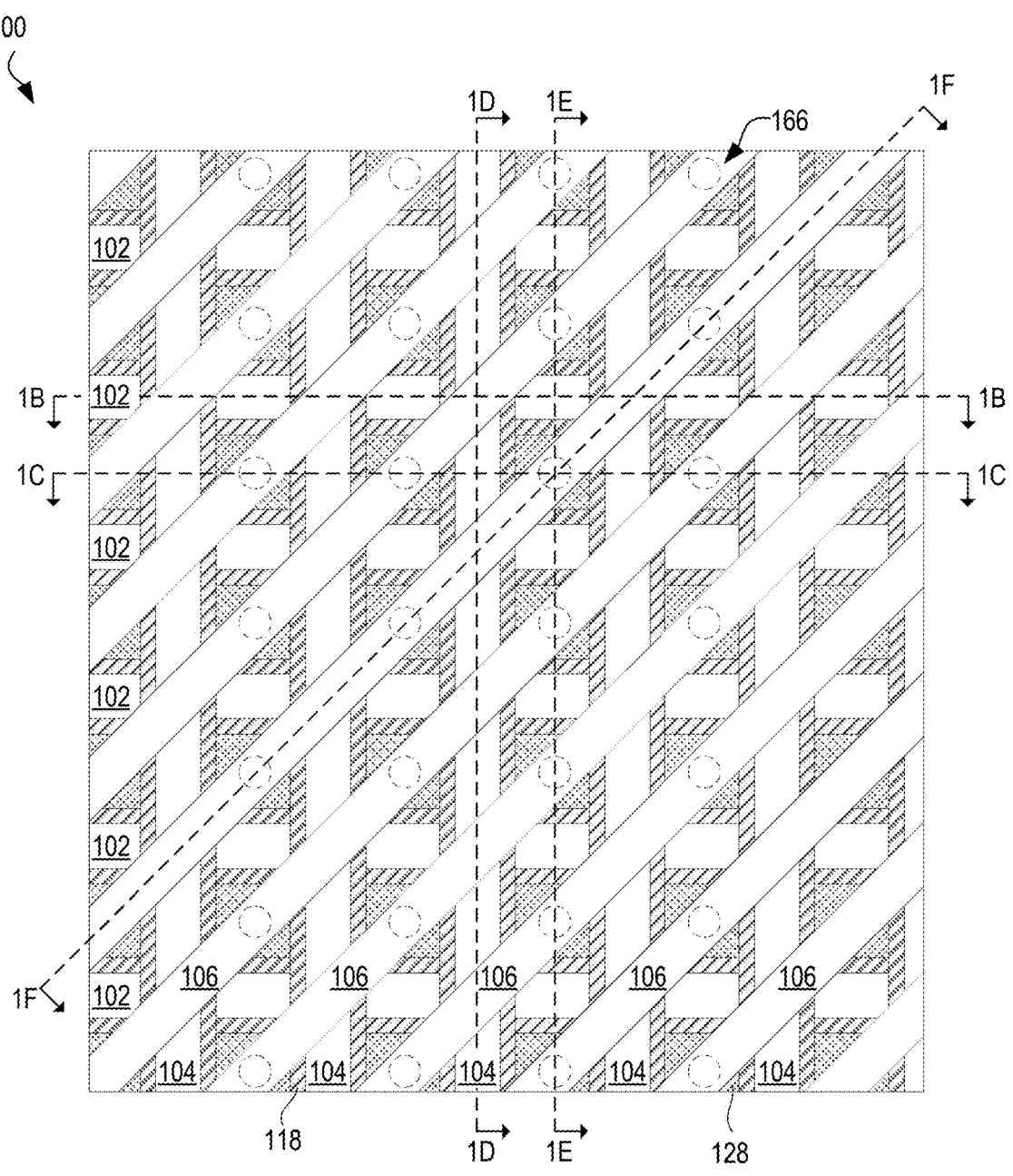
FIGS. 1A-1F illustrate various views of an example quantum dot device, in accordance with one embodiment.

Aspects of the present disclosure may include traces positioned both above and below a semiconductor stack in which spin qubits are defined. The traces may be used to provide static and/or dynamic electric and/or magnetic fields to define and/or control the spin qubits. The traces may be formed using processes such as flip chip and advanced back-side processing.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

Aspects of the disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

Some embodiments may have some, all, or none of the features described for other embodiments. "First," "second,"

"third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact, and "coupled" may indicate elements co-operate or interact, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, a substrate assembly feature, such as a through width, that is described as having substantially a listed dimension can vary within a few percent of the listed dimension.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, air). Examples of components that are communicatively coupled include integrated circuit dies located in the same package that communicate via an embedded bridge in a package substrate and an integrated circuit component attached to a printed circuit board that send signals to or receives signals from other integrated circuit components or electronic devices attached to the printed circuit board.

It will be understood that in the examples shown and described further below, the figures may not be drawn to scale and may not include all possible layers and/or circuit components. In addition, it will be understood that although certain figures illustrate transistor designs with source/drain regions, electrodes, etc. having orthogonal (e.g., perpendicular) boundaries, embodiments herein may implement such boundaries in a substantially orthogonal manner (e.g., within +/−5 or 10 degrees of orthogonality) due to fabrication methods used to create such devices or for other reasons.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

As used herein, the terms "upper"/"lower" or "above"/ "below" may refer to relative locations of an object (e.g., the surfaces described above), especially in light of examples shown in the attached figures, rather than an absolute location of an object. For example, an upper surface of an apparatus may be on an opposite side of the apparatus from a lower surface of the object, and the upper surface may be facing upward generally only when viewed in a particular way. As another example, a first object above a second object may be on or near an "upper" surface of the second object rather than near a "lower" surface of the object, and the first object may be truly above the second object only when the two objects are viewed in a particular way.

References are made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

A quantum computer uses quantum-mechanical phenomena such as superposition and entanglement to perform computations, simulations, or other functions. In contrast to digital computers, which store data in one of two definite states (0 or 1), quantum computation uses quantum bits (qubits), which can be in superpositions of states. Qubits may be implemented using physically distinguishable quantum states of elementary particles such as electrons and photons. For example, the polarization of a photon may be used where the two states are vertical polarization and horizontal polarization. Similarly, the spin of an electron may have distinguishable states such as "up spin" and "down spin." Qubits in quantum mechanical systems can be in a superposition of both states at the same time, a trait that is unique and fundamental to quantum computing.

Quantum computing systems execute algorithms containing quantum logic operations performed on qubits. In some cases, the result of the algorithm is not deterministic. The quantum algorithm may be repeated many times in order to determine a statistical distribution of results or in order to have a high likelihood of finding the correct answer. In some cases, a classical algorithm may be used to check if the quantum computer determined the correct result.

Qubits have been implemented using a variety of different technologies which are capable of manipulating and reading quantum states. These include but are not limited to quantum dot devices (spin based and spatial based), trapped-ion devices, superconducting quantum computers, optical lattices, nuclear magnetic resonance computers, solid-state NMR Kane quantum devices, electrons-on-helium quantum computers, cavity quantum electrodynamics (CQED) devices, molecular magnet computers, and fullerene-based ESR quantum computers, to name a few. Thus, while a quantum dot device is described below in relation to certain embodiments of the invention, the underlying principles of the invention may be employed in combination with any type of quantum computer, including, but not limited to, those listed above. The particular physical implementation used for qubits is not necessarily required for the embodiments of the invention described herein.

Quantum dots are structures in which particles such as electrons are confined in all three dimensions. Quantum dots may confine particles based on, e.g., semiconductor layer boundaries, physical size, electric fields, magnetic fields, and/or a combination thereof. Because of the confinement, quantum dots operate according to the rules of quantum mechanics, having optical and electronic properties which differ from macroscopic entities. Quantum dots are sometimes referred to as "artificial atoms" to connote the fact that a quantum dot is a single object with discrete, bound electronic states, as is the case with atoms or molecules.

Figures 1B, 1C:
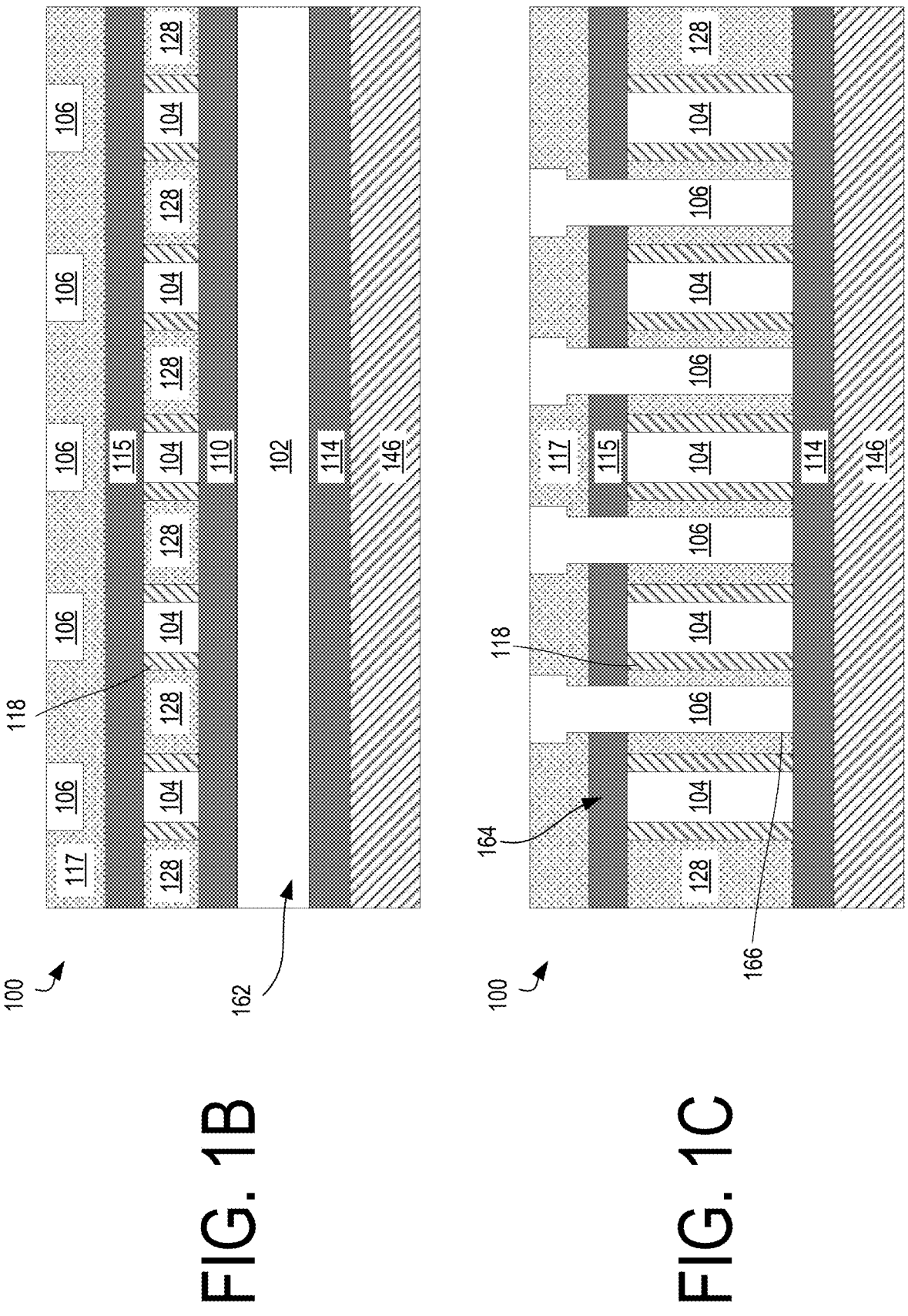
Figures 1D, 1E:
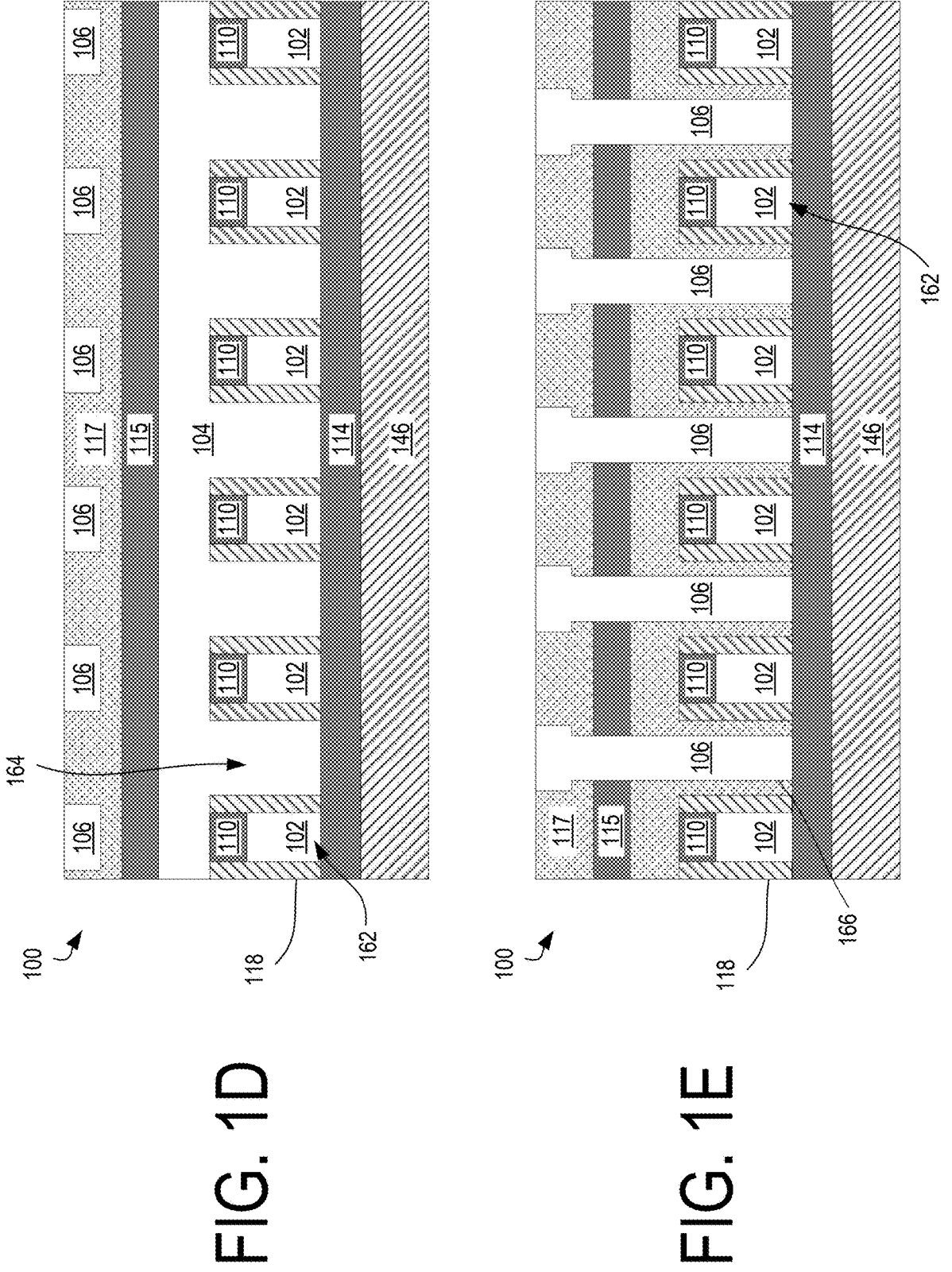
Figure 1F:
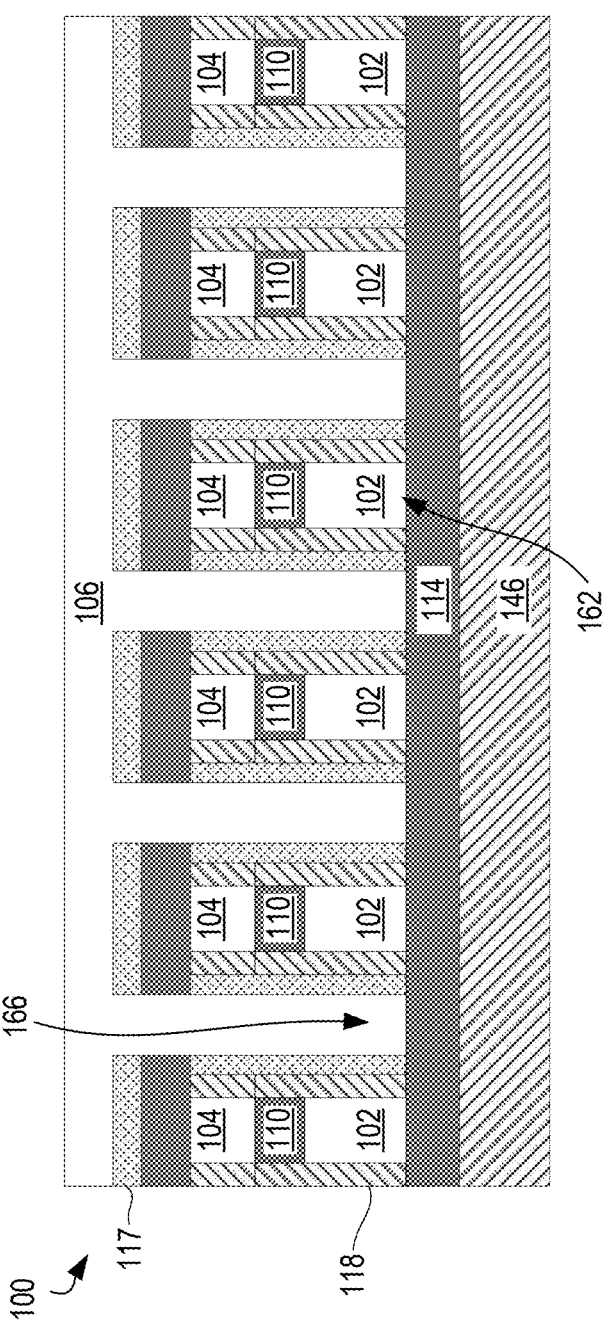
Figure 1F:

FIGS. 1A-1F are various views of a quantum dot device 100, which may be used with embodiments of the invention described below. FIG. 1A is a top view of a portion of the quantum dot device 100 with some of the materials removed so that the first gate lines 102, the second gate lines 104, and the third gate lines 106 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 1B-1F are side cross-sectional views of the quantum dot device 100 of FIG. 1A; in particular, FIG. 1B is a view through the section B-B of FIG. 1A, FIG. 1C is a view through the section C-C of FIG. 1A, FIG. 1D is a view through the section D-D of FIG. 1A, FIG. 1E is a view through the section E-E of FIG. 1A, and FIG. 1F is a view through the section F-F of FIG. 1A.

The quantum dot device 100 of FIG. 1 may be operated in any of a number of ways. For example, in some embodiments, electrical signals such as voltages, currents, radio frequency (RF), and/or microwave signals, may be provided to one or more first gate line 102, second gate line 104, and/or third gate line 106 to cause a quantum dot (e.g., an electron spin-based quantum dot or a hole spin-based quantum dot) to form in a quantum well stack 146 under a third gate 166 of a third gate line 106. Electrical signals provided to a third gate line 106 may control the electrical potential of a quantum well under the third gates 166 of that third gate line 106, while electrical signals provided to a first gate line 102 (and/or a second gate line 104) may control the potential energy barrier under the first gates 162 of that first gate line 102 (and/or the second gates 164 of that second gate line 104) between adjacent quantum wells. Quantum interactions between quantum dots in different quantum wells in the quantum well stack 146 (e.g., under different quantum dot gates) may be controlled in part by the potential energy barrier provided by the barrier potentials imposed between them (e.g., by intervening barrier gates).

Generally, the quantum dot devices 100 disclosed herein may further include a source of magnetic fields (not shown) that may be used to create an energy difference in the states of a quantum dot (e.g., the spin states of an electron spin-based quantum dot) that are normally degenerate, and the states of the quantum dots (e.g., the spin states) may be manipulated by applying electromagnetic energy to the gates lines to create quantum bits capable of computation. The source of magnetic fields may be one or more magnet lines. Thus, the quantum dot devices 100 disclosed herein may, through controlled application of electromagnetic energy, be able to manipulate the position, number, and quantum state (e.g., spin) of quantum dots in the quantum well stack 146.

In the quantum dot device 100 of FIG. 1, a gate dielectric 114 may be disposed on a quantum well stack 146. A quantum well stack 146 may include at least one quantum well layer (not shown in FIG. 1) in which quantum dots may be localized during operation of the quantum dot device 100. The gate dielectric 114 may be any suitable material, such as a high-k material. Multiple parallel first gate lines 102 may be disposed on the gate dielectric 114, and spacer material 118 may be disposed on side faces of the first gate lines 102. In some embodiments, a patterned hardmask 110 may be disposed on the first gate lines 102 (with the pattern corresponding to the pattern of the first gate lines 102), and the spacer material 118 may extend up the sides of the hardmask 110, as shown. The first gate lines 102 may each be a first gate 162. Different ones of the first gate lines 102 may be electrically controlled in any desired combination (e.g., each first gate line 102 may be separately electrically controlled, or some or all the first gate lines 102 may be shorted together in one or more groups, as desired).

Multiple parallel second gate lines 104 may be disposed over and between the first gate lines 102. As illustrated in FIG. 1, the second gate lines 104 may be arranged perpendicular to the first gate lines 102. The second gate lines 104 may extend over the hardmask 110, and may include second gates 164 that extend down toward the quantum well stack 146 and contact the gate dielectric 114 between adjacent ones of the first gate lines 102, as illustrated in FIG. 1D. In some embodiments, the second gates 164 may fill the area between adjacent ones of the first gate lines 102/spacer material 118 structures; in other embodiments, an insulating material (not shown) may be present between the first gate lines 102/spacer material 118 structures and the proximate second gates 164. In some embodiments, spacer material 118 may be disposed on side faces of the second gate lines 104; in other embodiments, no spacer material 118 may be disposed on side faces of the second gate lines 104. In some embodiments, a hardmask 115 may be disposed above the second gate lines 104. Multiple ones of the second gates 164 of a second gate line 104 are electrically continuous (due to the shared conductive material of the second gate line 104 over the hardmask 110). Different ones of the second gate lines 104 may be electrically controlled in any desired combination (e.g., each second gate line 104 may be separately electrically controlled, or some or all the second gate lines 104 may be shorted together in one or more groups, as desired). Together, the first gate lines 102 and the second gate lines 104 may form a grid, as depicted in FIG. 1.

Multiple parallel third gate lines 106 may be disposed over and between the first gate lines 102 and the second gate lines 104. As illustrated in FIG. 1, the third gate lines 106 may be arranged diagonal to the first gate lines 102, and diagonal to the second gate lines 104. In particular, the third gate lines 106 may be arranged diagonally over the openings in the grid formed by the first gate lines 102 and the second gate lines 104. The third gate lines 106 may include third gates 166 that extend down to the gate dielectric 114 in the openings in the grid formed by the first gate lines 102 and the second gate lines 104; thus, each third gate 166 may be bordered by two different first gate lines 102 and two different second gate lines 104. In some embodiments, the third gates 166 may be bordered by insulating material 128; in other embodiments, the third gates 166 may fill the openings in the grid (e.g., contacting the spacer material 118 disposed on side faces of the adjacent first gate lines 102 and the second gate lines 104, not shown). Additional insulating material 117 may be disposed on and/or around the third gate lines 106. Multiple ones of the third gates 166 of a third gate line 106 are electrically continuous (due to the shared conductive material of the third gate line 106 over the first gate lines 102 and the second gate lines 104). Different ones of the third gate lines 106 may be electrically controlled in any desired combination (e.g., each third gate line 106 may be separately electrically controlled, or some or all the third gate lines 106 may be shorted together in one or more groups, as desired).

Although FIGS. 1A-F illustrate a particular number of first gate lines 102, second gate lines 104, and third gate lines 106, this is simply for illustrative purposes, and any number of first gate lines 102, second gate lines 104, and third gate lines 106 may be included in a quantum dot device 100. Other examples of arrangements of first gate lines 102, second gate lines 104, and third gate lines 106 are possible. Electrical interconnects (e.g., vias and conductive lines) may contact the first gate lines 102, second gate lines 104, and third gate lines 106 in any desired manner.

Not illustrated in FIG. 1 are accumulation regions that may be electrically coupled to the quantum well layer of the quantum well stack 146 (e.g., laterally proximate to the quantum well layer). The accumulation regions may be spaced apart from the gate lines by a thin layer of an intervening dielectric material. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the third gates 166 (e.g., by controlling the voltages on the quantum dot gates, the first gates 162, and the second gates 164) to form carrier-based quantum dots (e.g., electron or hole quantum dots, including a single charge carrier, multiple charge carriers, or no charge carriers). In other embodiments, a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein.

Figure 2:
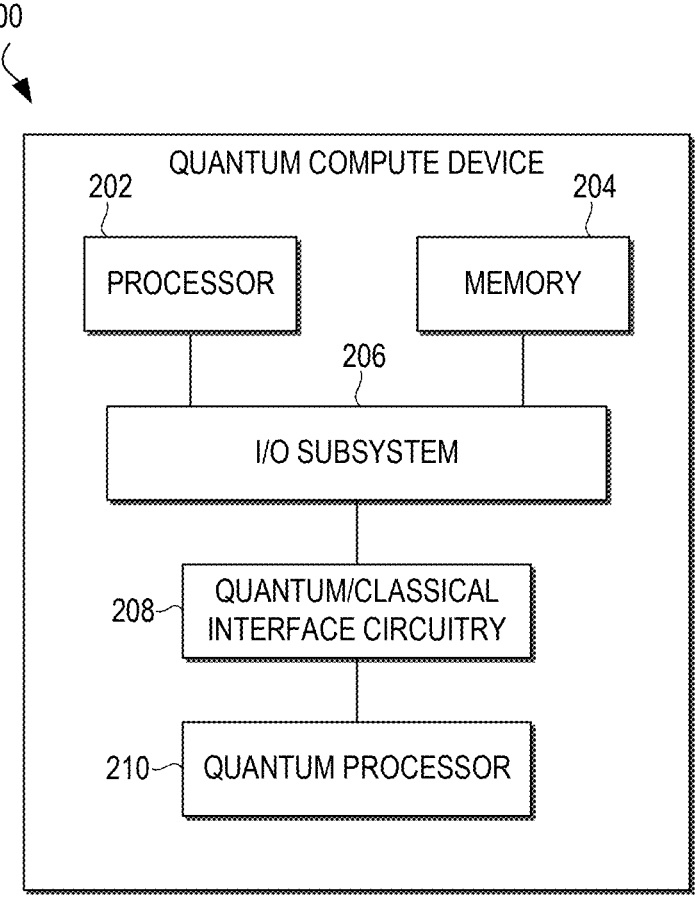
FIG. 2 is a simplified block diagram of at least one embodiment of a quantum compute device.

Referring now to FIG. 2, a simplified block diagram of a quantum compute device 200 is shown. In some embodiments, the quantum compute device 200 may include the quantum dot devices 100 described above in regard to FIGS. 1A-1F. The quantum compute device 200 may be embodied as or included in any type of compute device. For example, the quantum compute device 200 may include or otherwise be included in, without limitation, a server computer, an embedded computing system, a System-on-a-Chip (SoC), a multiprocessor system, a processor-based system, a consumer electronic device, a desktop computer, a laptop computer, a network device, a networked computer, a distributed computing system, and/or any other computing device. The illustrative quantum compute device 200 includes a processor 202, a memory 204, an input/output (I/O) subsystem 206, a quantum/classical interface circuitry 208, and a quantum processor 210. In some embodiments, one or more of the illustrative components of the quantum compute device 200 may be incorporated in, or otherwise form a portion of, another component. For example, the memory 204, or portions thereof, may be incorporated in the processor 202 in some embodiments. In some embodiments, the quantum compute device 200 may be embodied as the electrical device 2600 described below in regard to FIG. 26 or may include any suitable component of the electrical device 2600.

In some embodiments, the quantum compute device 200 may be located in a data center with other compute devices, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves), a micro data center, etc. In some embodiments, the quantum compute device 200 may receive jobs over a network (such as the Internet) to perform on the quantum processor 210. The quantum compute device 200 may perform the jobs on the quantum processor 210 and send the results back to the requesting device.

The processor 202 may be embodied as any type of processor capable of performing the functions described herein. For example, the processor 202 may be embodied as a single or multi-core processor(s), a single or multi-socket processor, a digital signal processor, a graphics processor, a neural network compute engine, an image processor, a microcontroller, or other processor or processing/controlling circuit. The processor 202 may include multiple processor cores. In some embodiments, the processor 202 supports quantum extensions to an existing ISA of the processor/core 202, allowing instructions that interface with the quantum/classical interface circuitry 208 and the quantum processor 210.

The memory 204 may be embodied as any type of volatile or non-volatile memory or data storage capable of performing the functions described herein. In operation, the memory 204 may store various data and software used during operation of the quantum compute device 200, such as operating systems, applications, programs, libraries, and drivers. The memory 204 is communicatively coupled to the processor 202 via the I/O subsystem 206, which may be embodied as circuitry and/or components to facilitate input/output operations with the processor 202, the memory 204, and other components of the quantum compute device 200. For example, the I/O subsystem 206 may be embodied as, or otherwise include, memory controller hubs, input/output control hubs, firmware devices, communication links (e.g., point-to-point links, bus links, wires, cables, light guides, printed circuit board traces, etc.) and/or other components and subsystems to facilitate the input/output operations. The I/O subsystem 206 may connect various internal and external components of the quantum compute device 200 to each other with use of any suitable connector, interconnect, bus, protocol, etc., such as an SoC fabric, PCIe®, USB2, USB3, USB4, NVMe®, Thunderbolt®, Compute Express Link (CXL), and/or the like. In some embodiments, the I/O subsystem 206 may form a portion of a system-on-a-chip (SoC) and be incorporated, along with the processor 202 and the memory 204 and other components of the quantum compute device 200 on a single integrated circuit chip.

The quantum/classical interface circuitry 208 is configured to interface with both classical components of the quantum compute device 200, such as the processor 202 and memory 204, as well as the quantum processor 210. The quantum/classical interface circuitry 208 may include a variety of analog or digital circuitry, such as analog-to-digital converters, digital-to-analog converters, high gain amplifiers, low noise amplifiers, cryogenic amplifiers, field-programmable gate arrays (FPGAs), classical processors, application-specific integrated circuits (ASICs), signal conditioning circuitry, etc. In some embodiments, some or all of the quantum/classical interface circuitry 208 may be inside of a refrigerator, such as a dilution refrigerator, a magnetic refrigerator, a helium-4 and/or helium-3 refrigerator, etc. Some or all of the components of the quantum/classical interface circuitry 208 may be at any suitable temperature, such as 10 millikelvin, 100 millikelvin, 4 Kelvin, 20 Kelvin, 77 Kelvin, room temperature or above, or anywhere in between.

The quantum processor 210 is configured to operate one or more qubits. The qubits may be any suitable type of qubit, such as a quantum dot spin qubit described above in regard to FIGS. 1A-1F. In other embodiments, the qubits may be, e.g., charge qubits, transmon qubits, microwave qubits, superconducting qubits, or any other suitable type of qubits. The quantum processor 210 may include any suitable number of physical or logical qubits, such as 1-10⁶. In the illustrative embodiment, some or all of the quantum processor 210 is in a refrigerator such as a dilution refrigerator. In particular, in the illustrative embodiment, the qubits are held at a temperature of about 10 millikelvin. In other embodiments, the qubits may be held at any suitable temperature, such as 1-100 millikelvin or higher, depending on the temperature sensitivity of the particular qubit in use.

The quantum processor 210 may be able to control the various qubits in various ways, such as by performing two-qubit gates, three-qubit gates, error correction operations, transferring a state from one type of qubit to another, measuring some, any or, all of the qubits, initializing some, any, or all of the qubits, etc.

The quantum compute device 200 may include additional components not shown in FIG. 2, such as one or more data storage devices, a network interface controller, one or more peripheral devices, etc.

Figure 3:
FIG. 3 illustrates an isometric view of an example quantum processor package.
Figure 3:
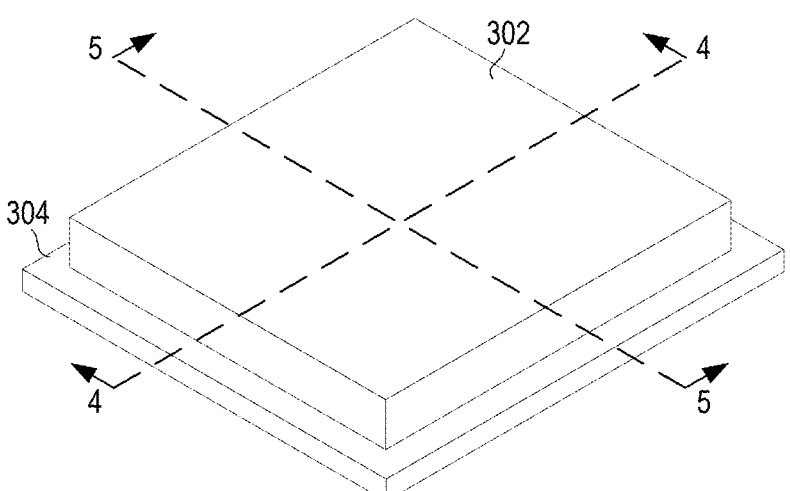
Figure 4:
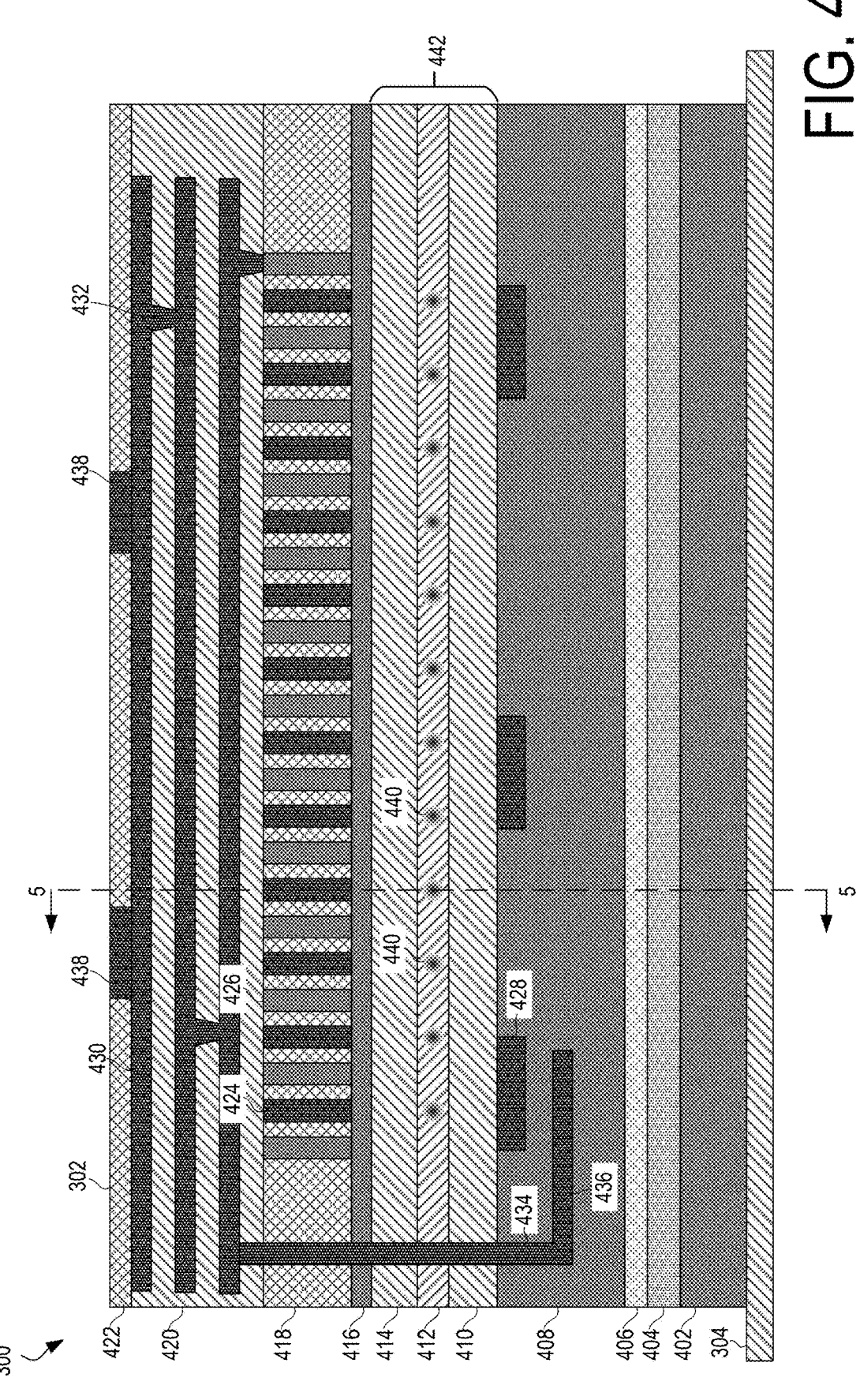
FIG. 4 illustrates a cross-sectional view of one embodiment of the quantum processor package of FIG. 3.
Figure 5:
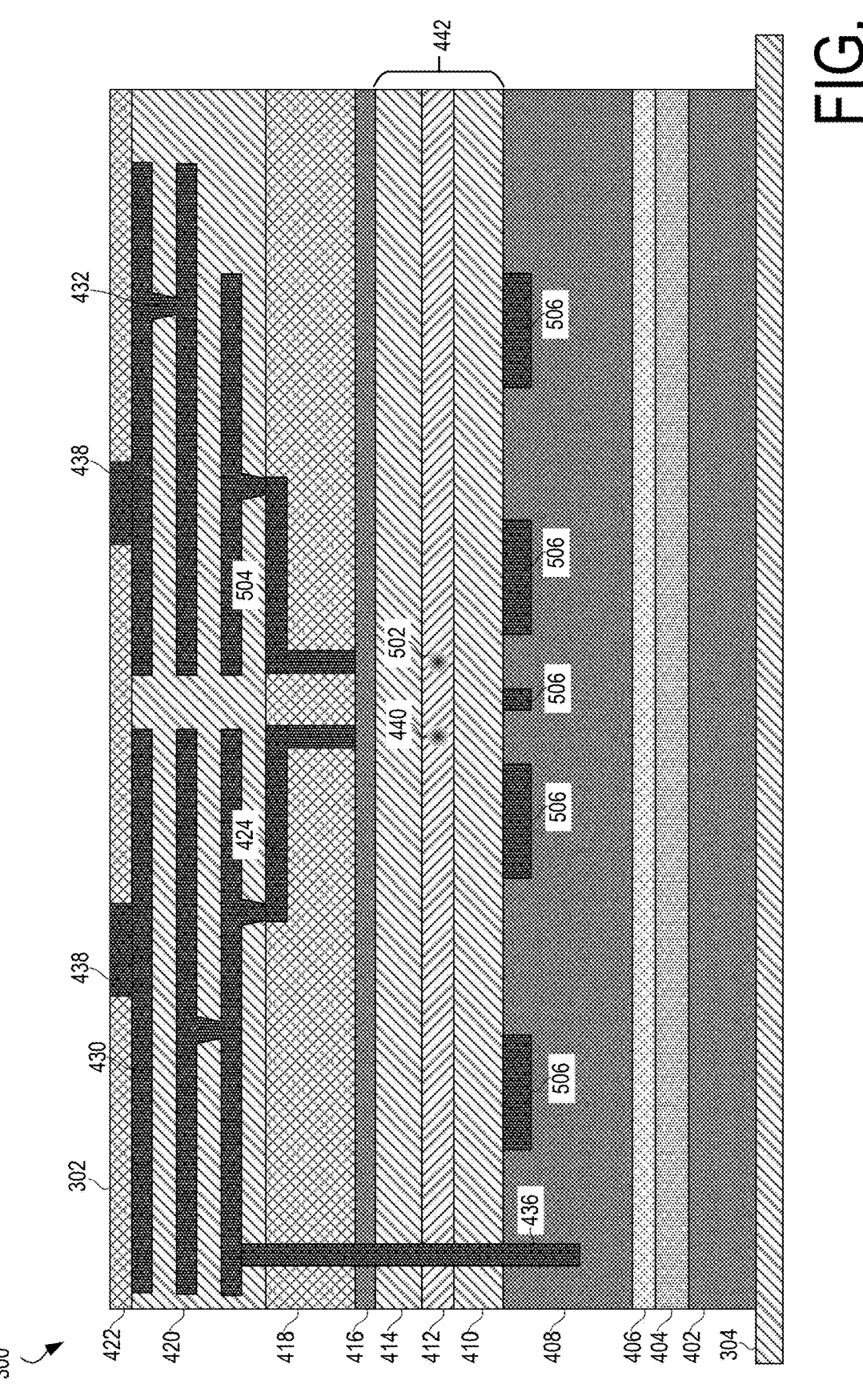
FIG. 5 illustrates a cross-sectional view of one embodiment of the quantum processor package of FIG. 3.
Figure 6:
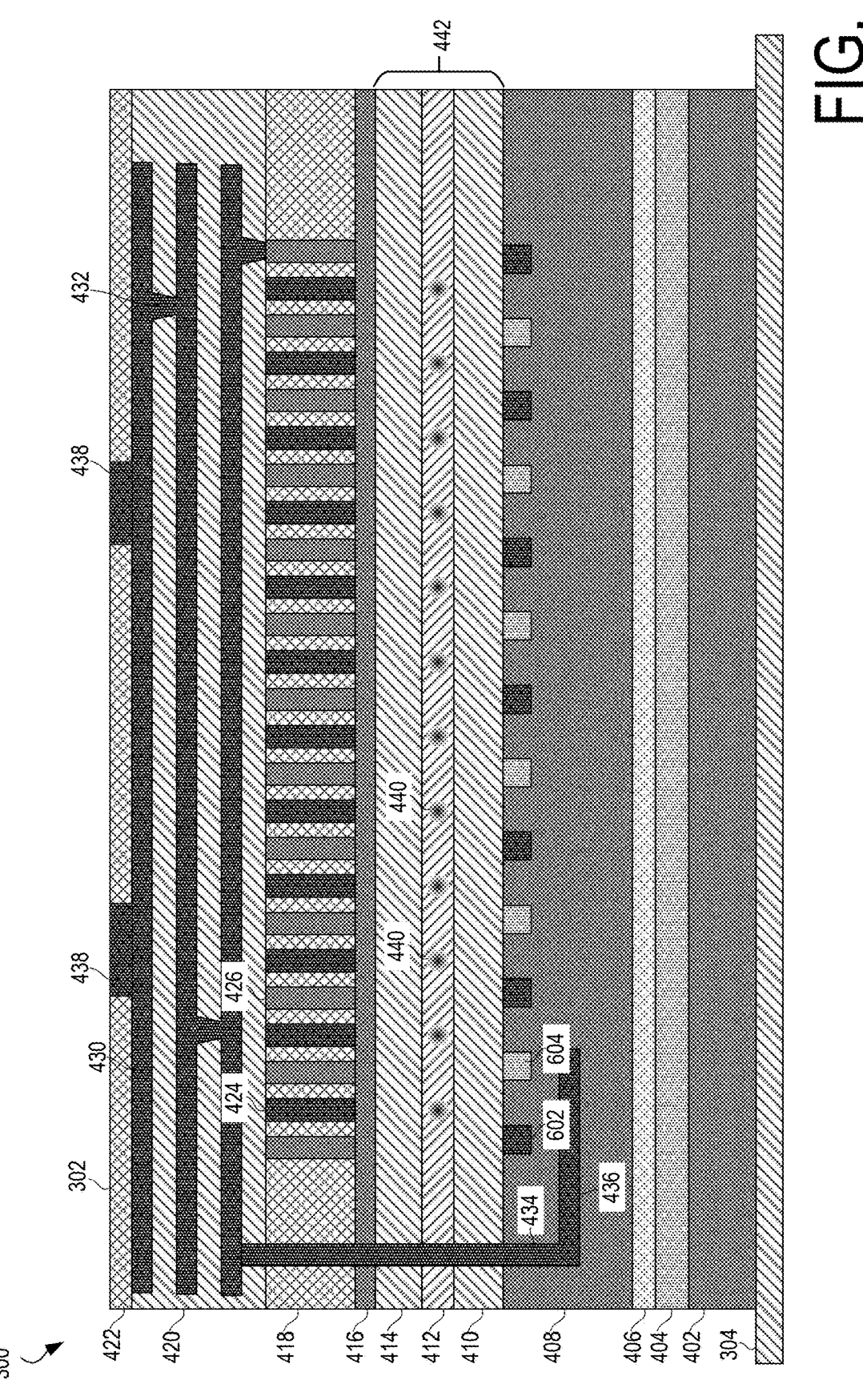
FIG. 6 illustrates a cross-sectional view of one embodiment of the quantum processor package of FIG. 3.

Referring now to FIGS. 3-6, in one embodiment, a quantum processor package 300 includes a quantum processor die 302 and a circuit board 304. FIG. 3 shows an isometric view of the quantum processor package 300. FIGS. 4 and 5 show a cross-sectional view of one embodiment of the quantum processor package 300. FIG. 6 shows a cross-sectional view of another embodiment of the quantum processor package 300.

The quantum processor die 302 includes several layers and structure within the layers. In one embodiment, the quantum processor die 302 includes a silicon layer 402, a dielectric layer 404, an adhesive layer 406, a dielectric layer 408, a silicon-germanium (SiGe) layer 410, a silicon layer 412, a SiGe layer 414, a dielectric layer 416, a dielectric layer 418, an interconnect layer 420, and a dielectric layer 422. As used herein, SiGe refers to an alloy with a molecular formula of $Si_{1-x} Ge_x$, where x may be any value between 10% and 90%, depending on the particular structure and function required. Any SiGe layer or region described herein may have 10% to 90% germanium by number of atoms unless a different range is explicitly required. In an illustrative embodiment, the SiGe layers 524, 528 are 25%-35% (or about 30%) germanium by number of atoms.

In an illustrative embodiment, the SiGe layer 410, silicon layer 412, and SiGe layer 414 form a stack 442 that defines a quantum well. Spin qubits 440 are defined in the silicon layer 412. The spin qubits 440 are defined by the quantum well and the electric and/or magnetic fields provided by the various traces 424, 426, 428 above and below the stack 442. For example, plunger gates 424 with positive voltages may alternate with barrier gates 426 with negative voltages to form an electrostatic potential for spin qubits 440 under the gates 424. The potential function for the qubits 440 may also be influenced by traces 428 below the stack 442 shown in FIG. 4 or by traces 506 below the stack 442 shown in FIG. 5. For example, traces 428, 506 may affect the various qubits 440 by different amounts, shifting the relative resonance frequencies for the qubits 440 by different amounts, making the qubits 440 more easily individually addressable. In some embodiments, voltages and/or currents applied to the traces 428, 506 may be used to tune valley splitting and/or modify the electron wave function within the silicon quantum well, or may increase an operating range of voltage by reducing vertical spillover. Additionally or alternatively, the traces 428, 506 may be used to control one, some, or all of the qubits 440 by applying changing electric or magnetic fields to the qubits 440, such as microwave pulses at specific qubit frequencies. In the illustrative embodiment, the qubits 440 are arranged in along an axis a linear array. In other embodiments, the qubits 440 may be arranged in another manner, such as a two- or three-dimensional array. The quantum processor die 302 may include any suitable number of qubits 440, such as 1-10⁶.

For example, in one embodiment, referring now to FIG. 6, traces 602, 604 may be positioned below the stack 442. Traces 602 may carry current into the page from the perspective of FIG. 6, and alternating traces 604 may carry current out of the page, from the perspective of FIG. 6. By tuning or changing the amount or direction of current in the traces 602, 604, the magnetic field experienced by the qubits 440 can be changed. As the amount and/or direction of the magnetic field a given trace 602, 604 applies to any given qubit 440 is different, the traces 602, 604 may be used to individually tune the resonance frequency of the qubits 440, allowing them to be individually addressed. Additionally or alternatively to the traces 602, 604 into and out of the page, traces may extend across the page, carrying current to the left and/or right across the page.

In an illustrative embodiment, individual qubits 440 in the array of qubits 440 can be coupled to a quantum dot 502 in an array of quantum dots 502 (see FIG. 5). Each quantum dot 502 forms part of a single-electron transistor that can be used to determine a state of the corresponding qubit 440. Each quantum dot 502 can be defined, addressed, and/or controlled using traces 504, 506, 428, etc., in a similar manner as the qubits 440. As used herein, a single-electron transistor includes few-electron transistors and does not necessarily operate in the single-electron regime unless explicitly stated otherwise, despite the name. It should be appreciated that the quantum processor package 300 and/or related or connected circuitry may include any suitable readout circuitry in place of the single-electron transistor based on the quantum dot 502. The state of the qubit 440 can be read using an Elzerman readout. When the spin qubit is in a spin-up state, the electron that forms the spin qubit 440 can couple to the quantum dot 502, changing the effective resistance of the single-electron transistor corresponding to the quantum dot 502.

It should be appreciated that the traces 428, 506, 602, 604 below the stack 442 may be arranged in any suitable manner to provide any suitable electric and/or magnetic fields to the qubits 440. For example, in some embodiments, there may be a trace 428 below each qubit 440 that corresponds to traces 424 and/or traces 426, which may be used to strengthen and/or contain the electric field applied to each qubit 440.

The various traces 424, 426, 428, 506, 602, 604 may be connected to suitable voltage and/or current sources using appropriate traces and interconnects. For example, interconnect layer 420 may include several layers of interconnects 430 and vias 432. Vias 436 may extend from interconnects 430 in the interconnect layer 420 to traces 436, 428, 506, 602, 604. Traces 438 may act as contacts or pads for connections off-die, such as wire bonds to pads or traces on the circuit board 304 or other dies.

The various traces 424, 426, 428, 430, 432, 436, 438, 504, 506, 602, 604, etc., may be any suitable conductive material or combination of materials, such as tungsten, titanium, niobium, copper, gold, polysilicon, etc. In some embodiments, traces that may carry relatively high current densities may be embodied as superconducting material and operate below a superconducting temperature for that material. For example, in some embodiments, the traces 602, 604 may be embodied as niobium. The traces 602, 604 may have any suitable maximum current density, such as up to 4.5 mega-amperes per square centimeter.

In the illustrative embodiment, the quantum processor package 300 may be in a cryogenic refrigerator. For example, the quantum processor die 302, including the qubits 440 and the quantum dots 502, may be held at, e.g., 10 millikelvin. The other components such as stimulus sources, receiver circuitry, control circuitry, etc., in the quantum/classical interface circuitry 208 may be at a higher temperature region of the refrigerator (such as a 100 mil-likelvin region, a 4 Kelvin region, a 20 Kelvin region, etc.) or may be outside of the refrigerator.

The quantum processor die 302 may be mounted on the circuit board 304 and/or integrated with one or more other dies on a package. The circuit board 304 may be any suitable material, such as FR-4. The circuit board 304 may have any suitable width or height, such as a width and/or height of 5-200 millimeters.

As discussed in more detail below in regard to FIGS. 7 and 8, the silicon layer 402, dielectric layer 404, and adhesive layer 406 may be included in the quantum proces-sor die 302 due to flip-chip processing. In some embodi-ments, the dielectric layer 404 may be a nitride or an oxide. In some embodiments, the quantum processor die 302 may include more, fewer, or different layers below the stack 442 and dielectric layer 408.

The dielectric layers 408, 416, 418, 422 and the dielectric in the interconnect layer 420 may be any suitable dielectric, such as silicon oxide, hafnium oxide, aluminum oxide, titanium oxide, a combination thereof, and/or the like. In one illustrative embodiment, the dielectric layer 416 is a high-k dielectric, such as hafnium oxide. In some embodiments, the quantum processor die 302 may include more or fewer layers than those shown in the figures. For example, in some embodiments, the dielectric layer 416 may be combined with the dielectric layer 418 and/or a dielectric layer may be included between the dielectric layer 408 with the traces 428, 506, 602, 604 and the SiGe layer 410.

The quantum processor die 302 may have any suitable dimensions, such as a length or width of 0.2-30 millimeters and a thickness of 0.05-5 millimeters. The various layers of the quantum processor die 302 may have any suitable thickness. For example, the silicon layer 412 and the SiGe layers 410, 414 may have a thickness of 5-500 nanometers. The various dielectric layers such as dielectric layers 408, 416, 418, 422 may have any suitable thickness, such as 10-500 nanometers. The interconnect layer 420, which may include several layers or levels of interconnects, may have any suitable thickness, such as 50 nanometers to 1 millime-ter. The various traces defining and/or controlling the qubits 440 and quantum dots 502, such as the traces 424, 426, 428, 504, 506, 602, 604 may be any suitable distance from the qubits 440 and quantum dots 502, such as 30-200 nanome-ters. It should be appreciated that traces 428, 506, 602, 604 below the stack 442 may be separated from the qubits 440 by a different distance than the traces 424, 426 above the stack 442. For example, the distance between the traces 428, 506, 602, 604 below the stack 442 and the qubits 440 may be, e.g., anywhere from 20%-500% of the distance between the traces 424, 426 above the stack 442 and the qubits 440. The ability to tune the different distances of the groups of trace independently may provide more flexibility in control of the qubits 440. The qubits 440, quantum dots 502, and/or the traces defining and/or controlling the qubits 440 and quantum dots 502 may have any suitable pitch, such as 50-200 nanometers. The quantum dots 502 may be separated from the qubits 440 by any suitable amount, such as 30-500 nanometers. The various traces, such as the traces 424, 426, 428, 504, 506, 602, 604, may have any suitable dimensions depending on, e.g., the anticipated applied voltage or cur-rent, such as a cross-sectional length or width of 10-500 nanometers.

It should be appreciated that the components shown in the quantum processor die 302 are merely some of the compo-nents, and the quantum processor die 302, the quantum processor package 300, and/or other connected circuitry may include additional components or layers not shown. For example, radiofrequency and/or microwave frequency sources may be coupled to traces and used to set, reset, or otherwise control qubits 440 or groups of qubits 440, including for two- or multi-qubit operations. The quantum processor package 300 may include any or all of the suitable features of the quantum dot device 100 described above in regard to FIGS. 1A-1F. The quantum processor die 302 may include qubits 440 defined in a different manner as the qubits 440 defined in the stack 442, such as a fin of a semiconductor material (e.g., silicon) surrounded on some or all sides by a dielectric. In some embodiments, the quantum processor die 302, the quantum processor package 300, and/or another component may apply other static or dynamic electric or magnetic fields. For example, in one embodiment, a mag-netic field gradient is applied across the plurality of qubits 440, such as by an electromagnet or permanent magnet near, on, or in the quantum processor die 302.

Figure 7:
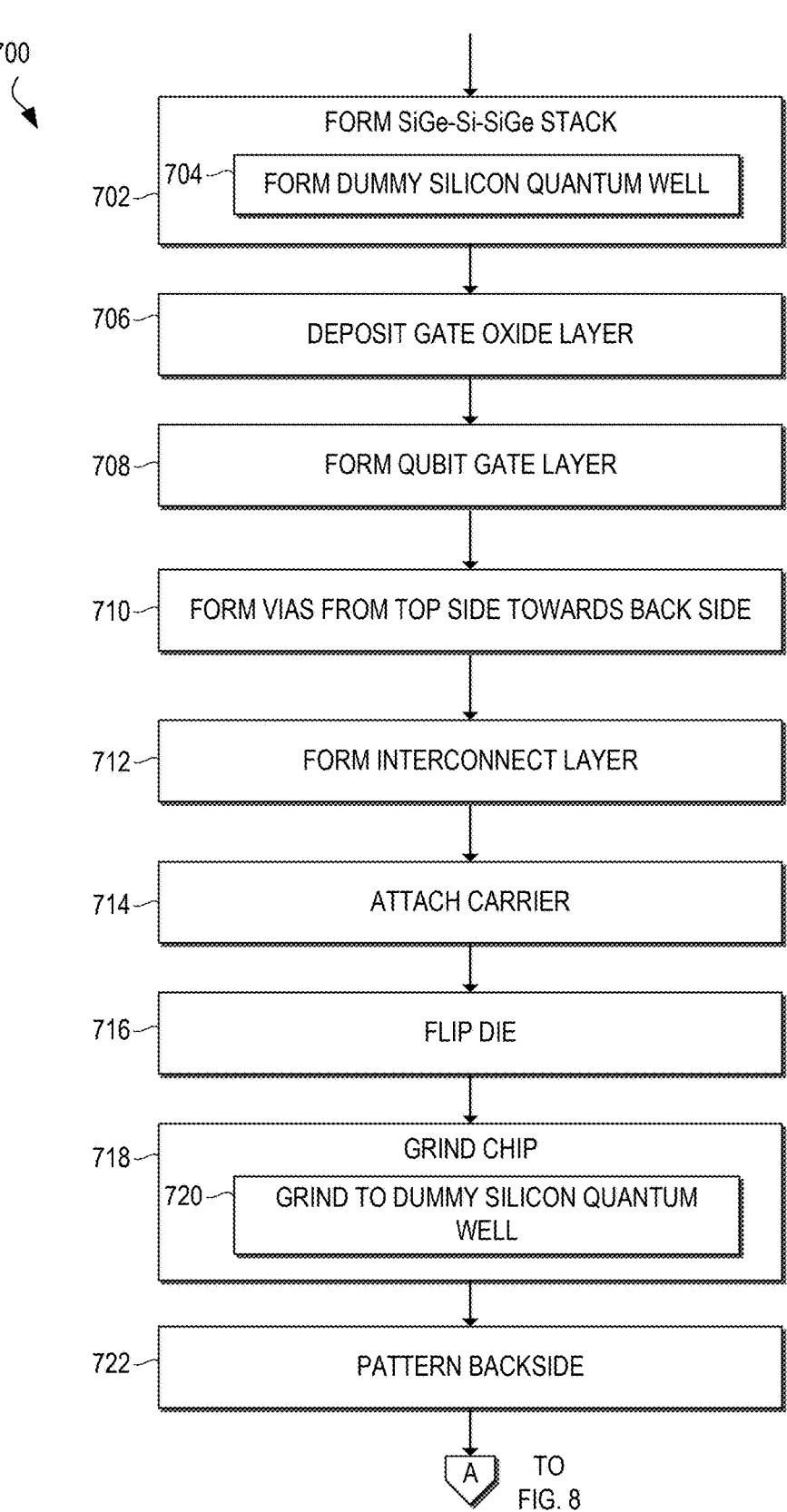
FIGS. 7 and 8 are a simplified flow diagram of at least one embodiment of a method for creating the quantum processor package of FIG. 3.
Figure 8:
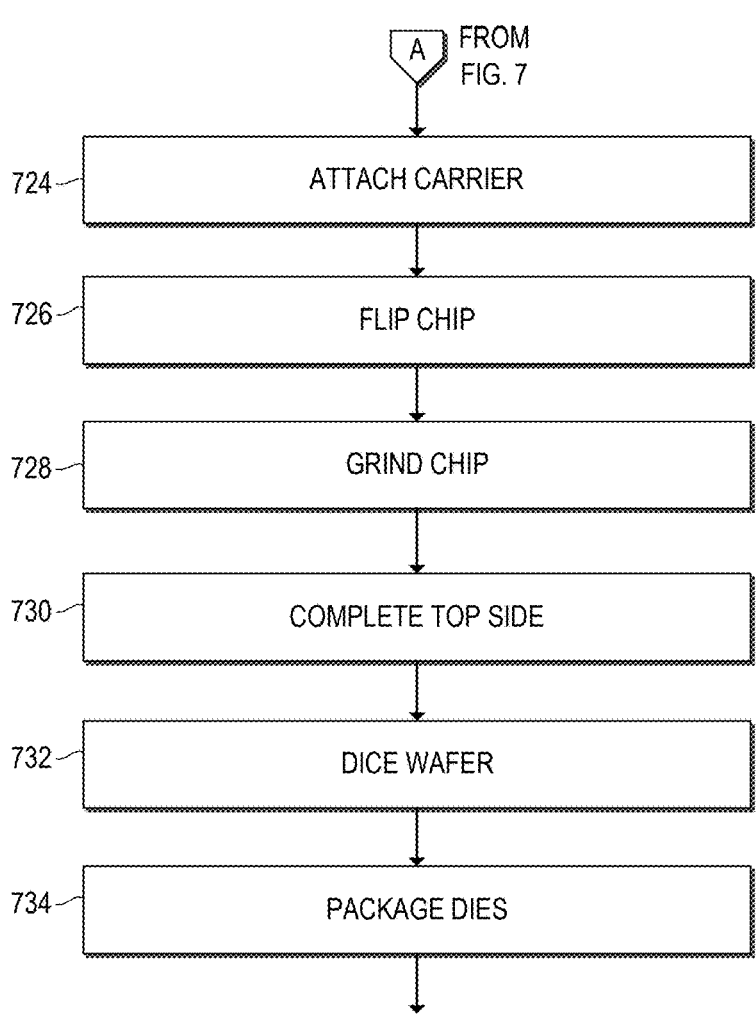
Figure 9:
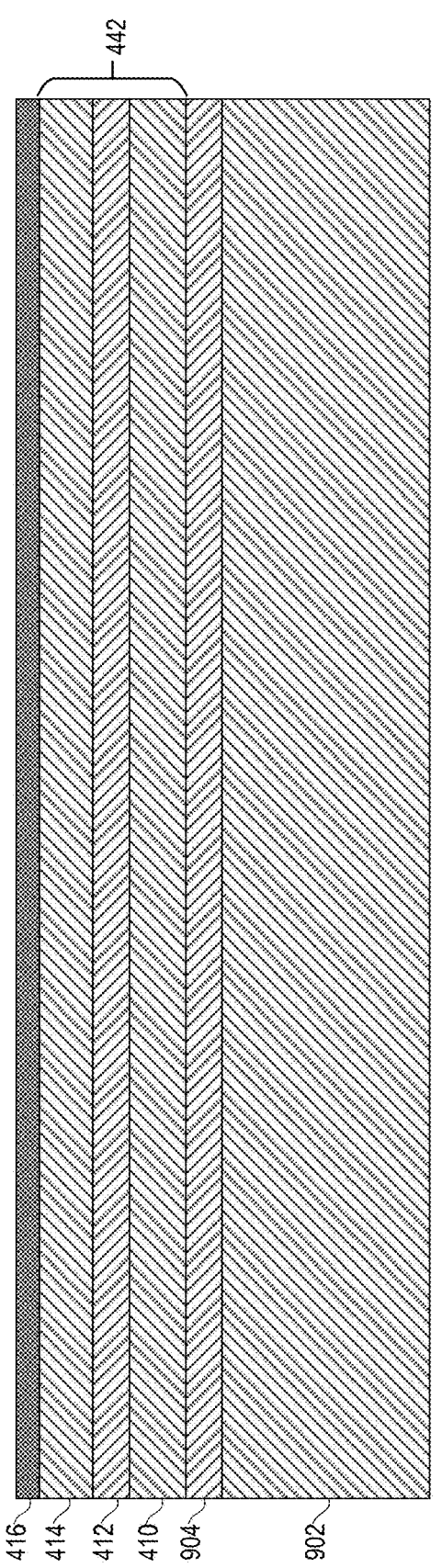
FIG. 9 illustrates a cross-sectional view of part of an example quantum processor die at one stage of the flow diagram of FIGS. 7 and 8.
Figure 9:

Referring now to FIGS. 7 and 8, in one embodiment, a flowchart for a method 700 for manufacturing a quantum processor package 300 is shown. The method 700 may be executed by a technician and/or by one or more automated machines. In some embodiments, one or more machines may be programmed to do some or all of the steps of the method 700. Such a machine may include, e.g., a memory, a processor, data storage, etc. The memory and/or data storage may store instructions that, when executed by the machine, causes the machine to perform some or all of the steps of the method 700. The method 700 may use any suitable set of techniques that are used in semiconductor or printed circuit board processing, such as chemical vapor deposition, atomic layer deposition, physical layer deposi-tion, molecular beam epitaxy, layer transfer, photolithogra-phy, ion implantation, dry etching, wet etching, thermal treatments, flip chip, layer transfer, magnetron sputter depo-sition, pulsed laser deposition, etc. In some embodiments, some or all steps of the method 700 may be performed at the wafer level, the die level, and/or the package level, as appropriate. For example, several of the steps of the method 700 are described as being done to a quantum processor die 302. However, the same or similar steps may be done on an entire wafer. It should be appreciated that the method 700 is merely one embodiment of a method to create the quantum processor package 300, and other methods may be used to create the quantum processor package 300. FIGS. 9-21 show cross-sectional views at various stages of the method 700.

The method 700 begins in block 702, in which a SiGe—Si—SiGe stack 442 is formed on a substrate 902 (e.g., the SiGe 410:Si 412:SiGe 414 stack. The substrate 902 may be SiGe and/or may be part of the SiGe layer 410, or may be another material, such as silicon or an insulator. In some embodiments, a dummy silicon layer 904 forming a dummy silicon quantum well may be formed before the stack 442 is formed in block 704. As discussed in more detail below, the dummy silicon layer 904 may be used as an indication of where the silicon layer 412 is while performing backside operations. In other embodiments, other approaches may be used, such as other markers or etch stop layers 904 made from different materials.

In block 706, a gate oxide layer 416 is deposited on the stack 442. The gate oxide layer 416 may be any suitable dielectric, such as a hafnium oxide. The gate oxide layer 416 and stack 442 is shown in a cross-sectional view in FIG. 9.

Figure 10:
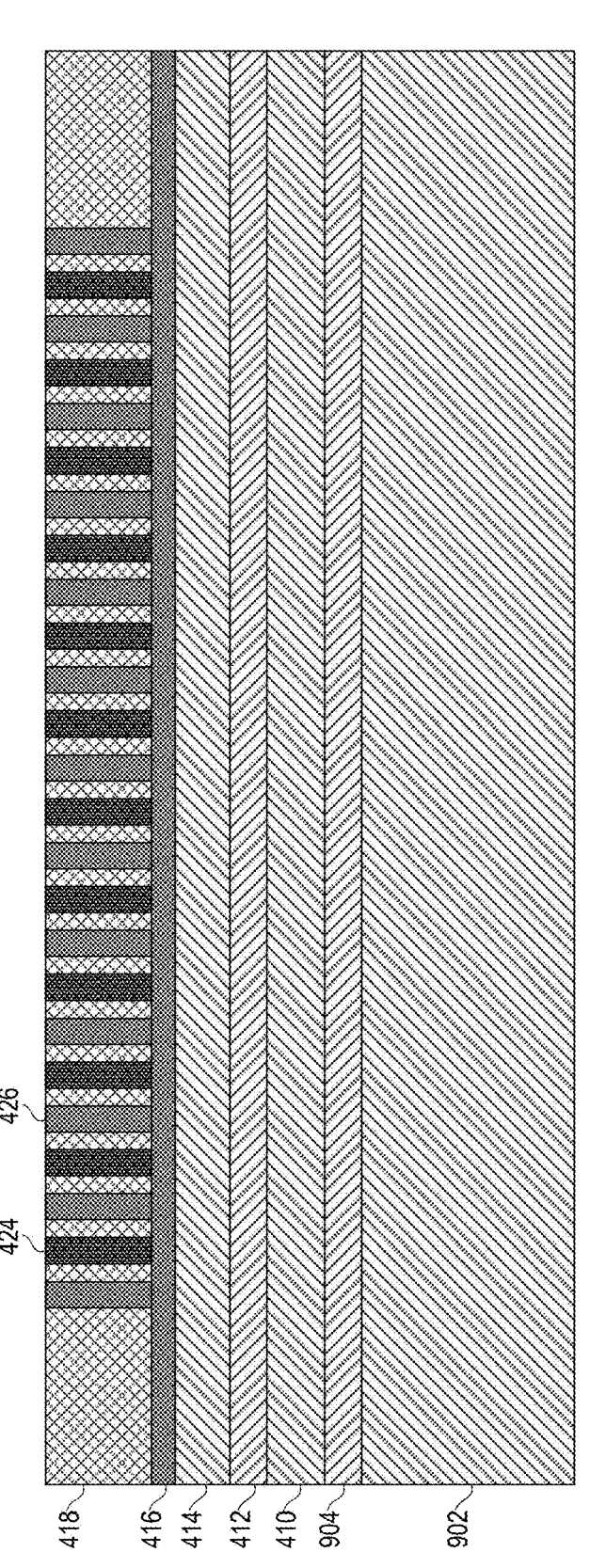
FIG. 10 illustrates a cross-sectional view of part of an example quantum processor die at one stage of the flow diagram of FIGS. 7 and 8.
Figure 10:

In block 708, a qubit gate layer is formed, including a dielectric layer 418 with traces 424, 426 that can be used to define and/or control the qubits 440 and quantum dots 502, as shown in FIG. 10.

Figure 11:
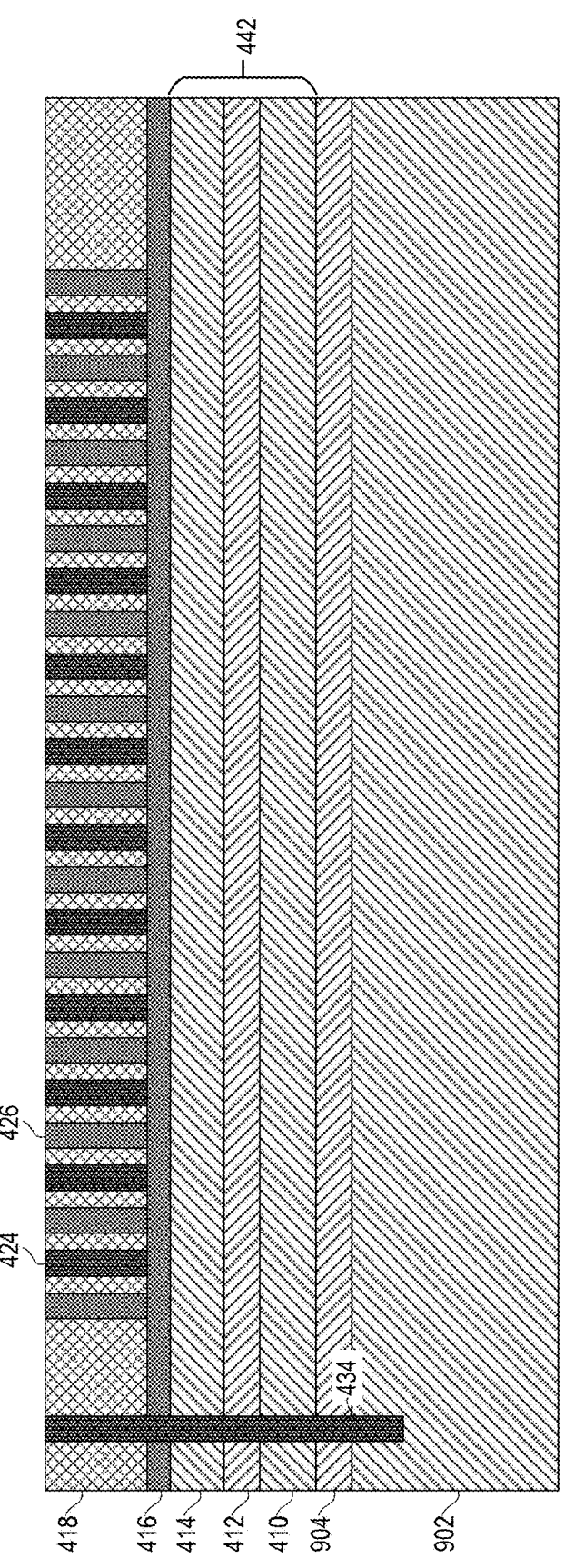
FIG. 11 illustrates a cross-sectional view of part of an example quantum processor die at one stage of the flow diagram of FIGS. 7 and 8.

In block 710, in an illustrative embodiment, one or more vias 434 are formed that extend from the top side of the die 302 towards the back side of the die 302, past the stack 442. A view of the quantum processor die 302 after block 710 is shown in FIG. 11. As used herein, top side and back side of the die 302 refer to opposite sides of the die 302. The assignment of which side is the "top" and which side is the "back" is arbitrary. In some cases, the top side may refer to the side of the die that is processed first or that is on top in a quantum processor package 300. However, in other cases, the opposite nomenclature may be used.

Figure 12:
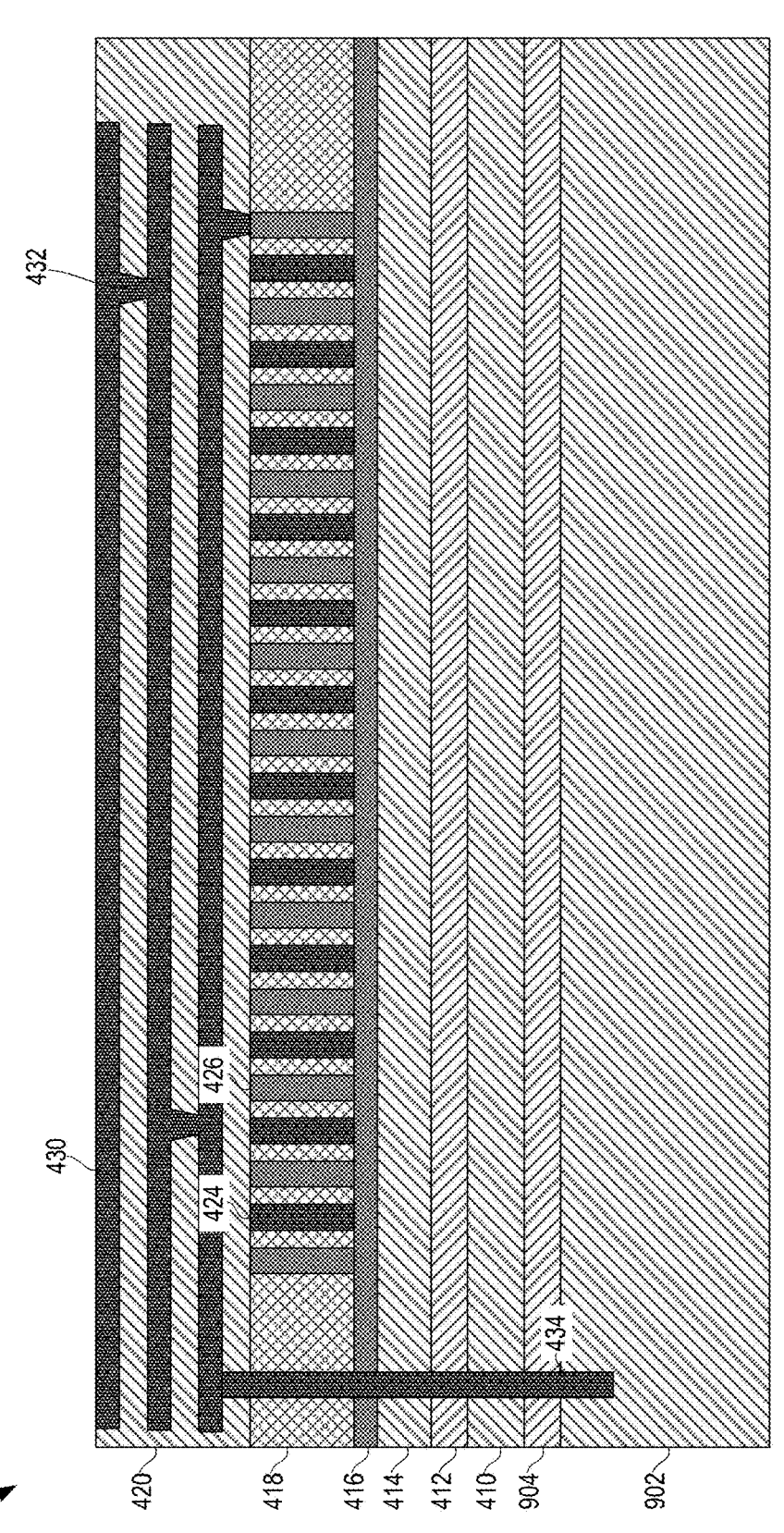
FIG. 12 illustrates a cross-sectional view of part of an example quantum processor die at one stage of the flow diagram of FIGS. 7 and 8.

In block 712, one or more interconnect layers 420 with interconnects 430 and vias 432 are formed over the traces 424, 426. The interconnect layers 420 may connect to the traces 424, 426. A view of the quantum processor die 302 after block 712 is shown in FIG. 12.

Figure 13:
FIG. 13 illustrates a cross-sectional view of part of an example quantum processor die at one stage of the flow diagram of FIGS. 7 and 8.

In block 714, a carrier is attached to the quantum processor die 302. The carrier may be embodied as, e.g., a silicon layer 1304 and an adhesive layer 1302. In some embodiments, a dielectric layer 422 is deposited over the interconnect layer 420 before the carrier is attached. A view of the quantum processor die 302 after block 714 is shown in FIG. 13.

Figure 14:
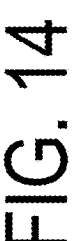
FIG. 14 illustrates a cross-sectional view of part of an example quantum processor die at one stage of the flow diagram of FIGS. 7 and 8.

In block 716, the chip 302 is flipped over onto its other side for back-side processing. A view of the quantum processor die 302 after block 716 is shown in FIG. 14.

Figure 15:
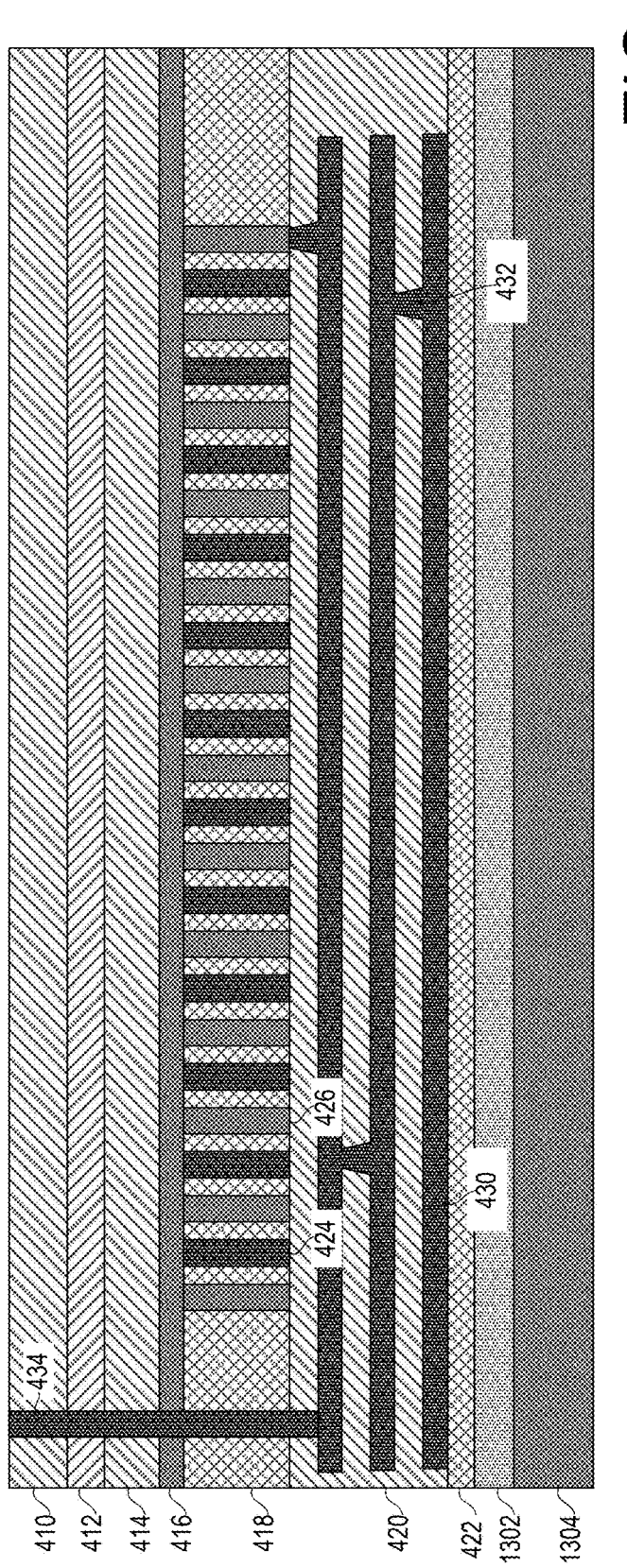
FIG. 15 illustrates a cross-sectional view of part of an example quantum processor die at one stage of the flow diagram of FIGS. 7 and 8.

In block 718, the chip 302 is ground down to expose the SiGe layer 410 of the stack 442. The chip 302 may be ground in any suitable manner, such as using physical or chemical grinding or etching. In some embodiments, a selective etchant may be used that will etch the chip 302 until an etch stop layer, such as the silicon layer 904, is reached in block 720. Additionally or alternatively, in some embodiments, the chip 302 may be mechanically ground until the silicon layer 904 is reached, allowing for calibration of where the silicon layer 412 is. A view of the quantum processor die 302 after block 718 is shown in FIG. 15.

Figure 16:
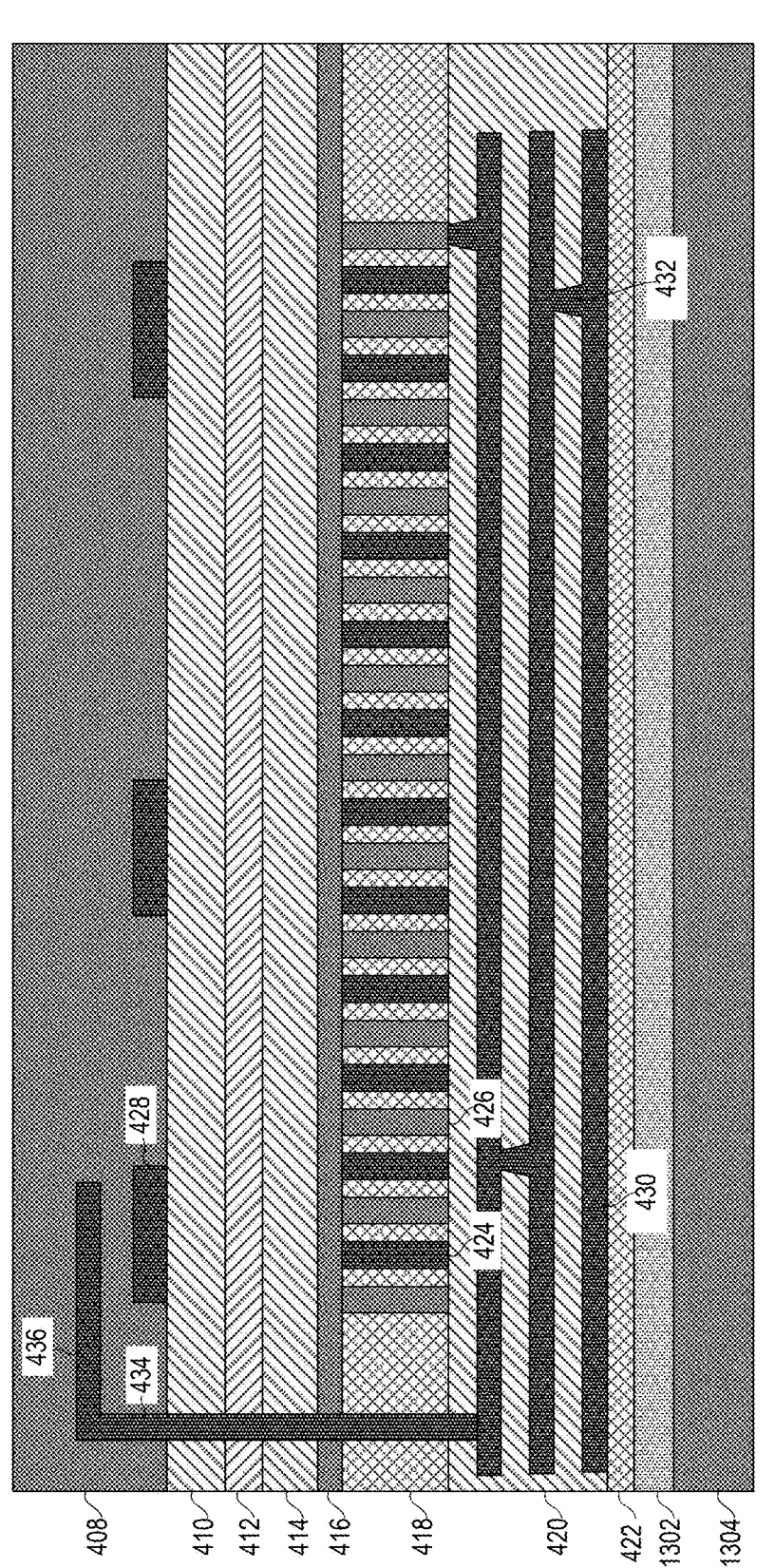
FIG. 16 illustrates a cross-sectional view of part of an example quantum processor die at one stage of the flow diagram of FIGS. 7 and 8.

In block 722, the backside of the die 302 is patterned. For example, traces 428, 436 may be deposited and vias 434 may be deposited, extended, and or connected to other traces. A view of the quantum processor die 302 after block 722 is shown in FIG. 16.

Figure 17:
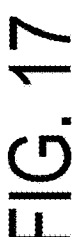
FIG. 17 illustrates a cross-sectional view of part of an example quantum processor die at one stage of the flow diagram of FIGS. 7 and 8.

Referring now to FIG. 8, in block 724, another carrier is attached to the die. The carrier may be embodied as, e.g., a silicon layer 402, a dielectric layer 404, and an adhesive layer 406. A view of the quantum processor die 302 after block 724 is shown in FIG. 17.

Figure 18:
FIG. 18 illustrates a cross-sectional view of part of an example quantum processor die at one stage of the flow diagram of FIGS. 7 and 8.

In block 726, the chip 302 is flipped back over. A view of the quantum processor die 302 after block 726 is shown in FIG. 18.

Figure 19:
FIG. 19 illustrates a cross-sectional view of part of an example quantum processor die at one stage of the flow diagram of FIGS. 7 and 8.

In block 728, the chip 302 is ground down, exposing the dielectric layer 422. A view of the quantum processor die 302 after block 728 is shown in FIG. 19. The chip 302 may be ground down in a similar manner as in block 718.

Figure 20:
FIG. 20 illustrates a cross-sectional view of part of an example quantum processor die at one stage of the flow diagram of FIGS. 7 and 8.

In block 730, the top side of the die 302 is completed. For example, part of the dielectric layer 422 may be etched away, and traces 438 may be patterned. In some embodiments, interconnect layers 420 or other traces 424, 426, 430, etc., may be deposited in block 730. A view of the quantum processor die 302 after block 730 is shown in FIG. 20.

Figure 21:
FIG. 21 illustrates a cross-sectional view of part of an example quantum processor package at one stage of the flow diagram of FIGS. 7 and 8.

In block 732, in embodiments in which blocks 702-730 were done at the wafer level, the wafer including the die 302 is diced. In block 734, the die 302 is packaged, such as by placing the die 302 on a circuit board 304, as shown in FIG. 21. The die 302 may be packaged with other dies or circuitry on the circuit board 304.

It should be appreciated that the embodiment described above is merely one possible approach to creating the quantum processor die 302. For example, in other embodiments, the quantum processor die 302 may be created using a single flip of the die 302 rather than two. Some or all of the layers above or below the stack 442 may be applied using layer transfer in addition to or instead of using flip chip techniques.

Figure 22:
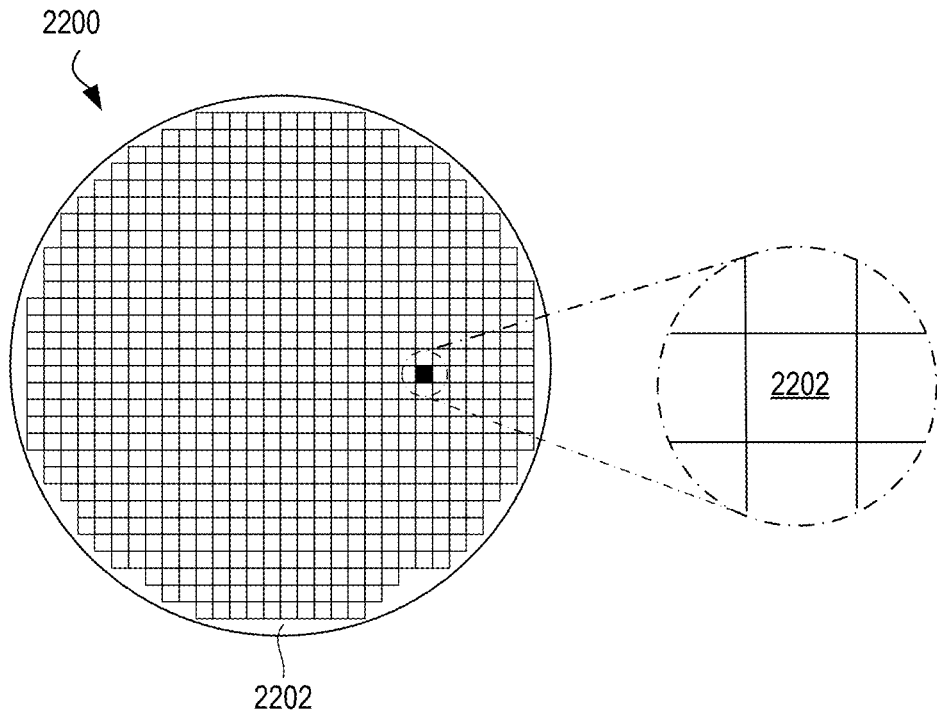
FIG. 22 is a top view of a wafer and dies, in accordance with any of the embodiments disclosed herein.

FIG. 22 is a top view of a wafer 2200 and dies 2202 that may be included in any of the quantum processor packages 300 disclosed herein (e.g., as any suitable ones of the dies 302). The wafer 2200 may be composed of semiconductor material and may include one or more dies 2202 having integrated circuit structures formed on a surface of the wafer 2200. The individual dies 2202 may be a repeating unit of an integrated circuit product that includes any suitable integrated circuit. After the fabrication of the semiconductor product is complete, the wafer 2200 may undergo a singulation process in which the dies 2202 are separated from one another to provide discrete "chips" of the integrated circuit product. The die 2202 may be any of the dies 302 disclosed herein. The die 2202 may include one or more transistors (e.g., some of the transistors 2340 of FIG. 23, discussed below), supporting circuitry to route electrical signals to the transistors, passive components (e.g., signal traces, resistors, capacitors, or inductors), and/or any other integrated circuit components. In some embodiments, the wafer 2200 or the die 2202 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 2202. For example, a memory array formed by multiple memory devices may be formed on a same die 2202 as a processor unit (e.g., the processor unit 2602 of FIG. 26) or other logic that is configured to store information in the memory devices or execute instructions stored in the memory array. Various ones of the quantum processor packages 300 disclosed herein may be manufactured using a die-to-wafer assembly technique in which some dies 302 are attached to a wafer 2200 that include others of the dies 302, and the wafer 2200 is subsequently singulated.

Figure 23:
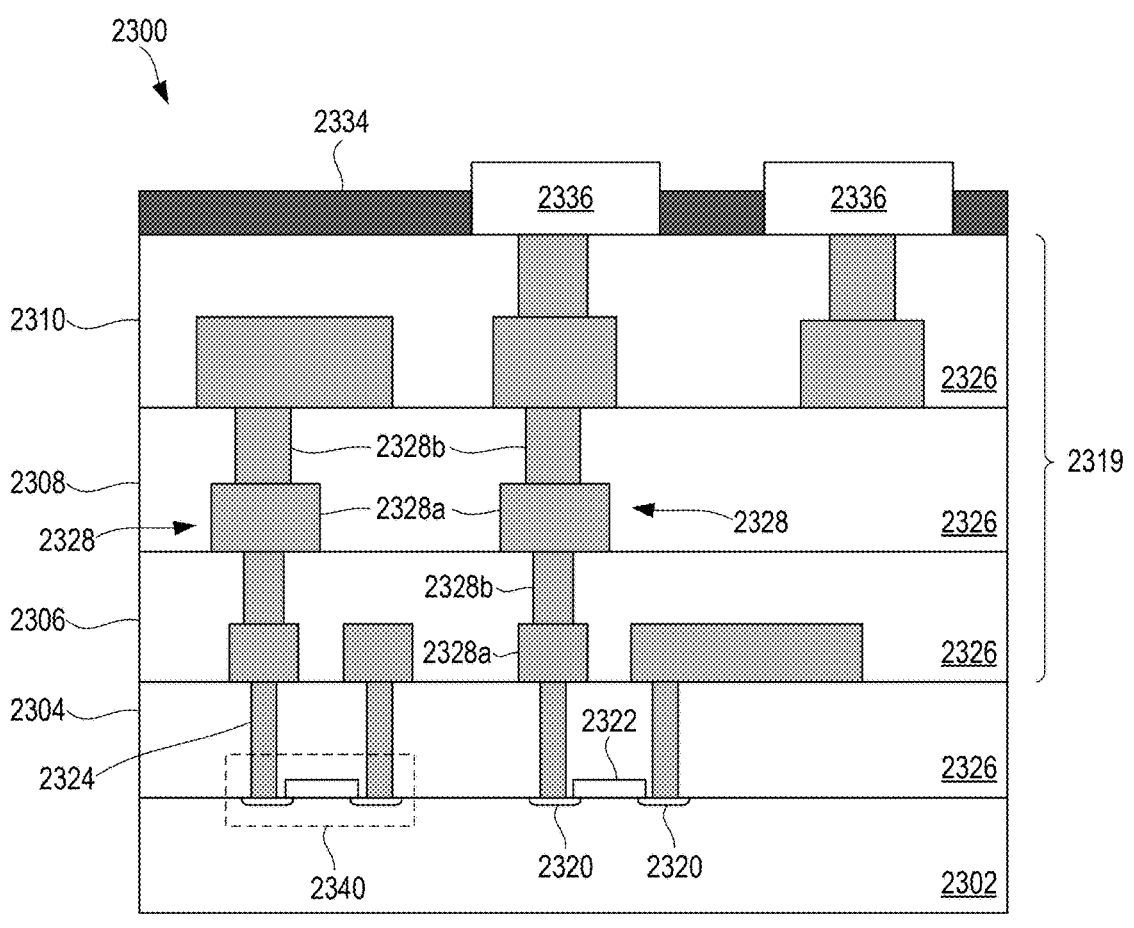
FIG. 23 is a cross-sectional side view of an integrated circuit, in accordance with any of the embodiments disclosed herein.

FIG. 23 is a cross-sectional side view of an integrated circuit device 2300 that may be included in any of the quantum processor packages 300 disclosed herein (e.g., in any of the dies 302). One or more of the integrated circuit devices 2300 may be included in one or more dies 2202 (FIG. 22). The integrated circuit device 2300 may be formed on a die substrate 2302 (e.g., the wafer 2200 of FIG. 22) and may be included in a die (e.g., the die 2202 of FIG. 22). The die substrate 2302 may be a semiconductor substrate composed of semiconductor material systems including, for example, n-type or p-type materials systems (or a combination of both). The die substrate 2302 may include, for example, a crystalline substrate formed using a bulk silicon or a silicon-on-insulator (SOI) substructure. In some embodiments, the die substrate 2302 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 2302. Although a few examples of materials from which the die substrate 2302 may be formed are described here, any material that may serve as a foundation for an integrated circuit device 2300 may be used. The die substrate 2302 may be part of a singulated die (e.g., the dies 2202 of FIG. 22) or a wafer (e.g., the wafer 2200 of FIG. 22).

The integrated circuit device 2300 may include one or more device layers 2304 disposed on the die substrate 2302. The device layer 2304 may include features of one or more transistors 2340 (e.g., metal oxide semiconductor field-effect transistors (MOSFETs)) formed on the die substrate 2302. The transistors 2340 may include, for example, one or more source and/or drain (S/D) regions 2320, a gate 2322 to control current flow between the S/D regions 2320, and one or more S/D contacts 2324 to route electrical signals to/from the S/D regions 2320. The transistors 2340 may include additional features not depicted for the sake of clarity, such as device isolation regions, gate contacts, and the like. The transistors 2340 are not limited to the type and configuration depicted in FIG. 23 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

FIGS. 24A-24D are simplified perspective views of example planar, FinFET, gate-all-around, and stacked gate-all-around transistors. The transistors illustrated in FIGS. 24A-24D are formed on a substrate 2416 having a surface 2408. Isolation regions 2414 separate the source and drain regions of the transistors from other transistors and from a bulk region 2418 of the substrate 2416.

FIG. 24A is a perspective view of an example planar transistor 2400 comprising a gate 2402 that controls current flow between a source region 2404 and a drain region 2406. The transistor 2400 is planar in that the source region 2404 and the drain region 2406 are planar with respect to the substrate surface 2408.

FIG. 24B is a perspective view of an example FinFET transistor 2420 comprising a gate 2422 that controls current flow between a source region 2424 and a drain region 2426. The transistor 2420 is non-planar in that the source region 2424 and the drain region 2426 comprise "fins" that extend upwards from the substrate surface 2428. As the gate 2422 encompasses three sides of the semiconductor fin that extends from the source region 2424 to the drain region 2426, the transistor 2420 can be considered a tri-gate transistor. FIG. 24B illustrates one S/D fin extending through the gate 2422, but multiple S/D fins can extend through the gate of a FinFET transistor.

FIG. 24C is a perspective view of a gate-all-around (GAA) transistor 2440 comprising a gate 2442 that controls current flow between a source region 2444 and a drain region 2446. The transistor 2440 is non-planar in that the source region 2444 and the drain region 2446 are elevated from the substrate surface 2428.

FIG. 24D is a perspective view of a GAA transistor 2460 comprising a gate 2462 that controls current flow between multiple elevated source regions 2464 and multiple elevated drain regions 2466. The transistor 2460 is a stacked GAA transistor as the gate controls the flow of current between multiple elevated S/D regions stacked on top of each other. The transistors 2440 and 2460 are considered gate-all-around transistors as the gates encompass all sides of the semiconductor portions that extends from the source regions to the drain regions. The transistors 2440 and 2460 can alternatively be referred to as nanowire, nanosheet, or nanoribbon transistors depending on the width (e.g., widths 2448 and 2468 of transistors 2440 and 2460, respectively) of the semiconductor portions extending through the gate.

Returning to FIG. 23, a transistor 2340 may include a gate 2322 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 2340 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 2340 along the source-channel-drain direction, the gate electrode may consist of a U-shaped structure that includes a bottom portion substantially parallel to the surface of the die substrate 2302 and two sidewall portions that are substantially perpendicular to the top surface of the die substrate 2302. In other embodiments, at least one of the metal layers that form the gate electrode may simply be a planar layer that is substantially parallel to the top surface of the die substrate 2302 and does not include sidewall portions substantially perpendicular to the top surface of the die substrate 2302. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2320 may be formed within the die substrate 2302 adjacent to the gate 2322 of individual transistors 2340. The S/D regions 2320 may be formed using an implantation/diffusion process or an etching/deposition process, for example. In the former process, dopants such as boron, aluminum, antimony, phosphorous, or arsenic may be ion-implanted into the die substrate 2302 to form the S/D regions 2320. An annealing process that activates the dopants and causes them to diffuse farther into the die substrate 2302 may follow the ion-implantation process. In the latter process, the die substrate 2302 may first be etched to form recesses at the locations of the S/D regions 2320. An epitaxial deposition process may then be carried out to fill the recesses with material that is used to fabricate the S/D regions 2320. In some implementations, the S/D regions 2320 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2320 may be formed using one or more alternate semiconductor materials such as germanium or a group III-V material or alloy. In further embodiments, one or more layers of metal and/or metal alloys may be used to form the S/D regions 2320.

Electrical signals, such as power and/or input/output (I/O) signals, may be routed to and/or from the devices (e.g., transistors 2340) of the device layer 2304 through one or more interconnect layers disposed on the device layer 2304 (illustrated in FIG. 23 as interconnect layers 2306-2310). For example, electrically conductive features of the device layer 2304 (e.g., the gate 2322 and the S/D contacts 2324) may be electrically coupled with the interconnect structures 2328 of the interconnect layers 2306-2310. The one or more interconnect layers 2306-2310 may form a metallization stack (also referred to as an "ILD stack") 2319 of the integrated circuit device 2300.

The interconnect structures 2328 may be arranged within the interconnect layers 2306-2310 to route electrical signals according to a wide variety of designs; in particular, the arrangement is not limited to the particular configuration of interconnect structures 2328 depicted in FIG. 23. Although a particular number of interconnect layers 2306-2310 is depicted in FIG. 23, embodiments of the present disclosure include integrated circuit devices having more or fewer interconnect layers than depicted.

In some embodiments, the interconnect structures 2328 may include lines 2328a and/or vias 2328b filled with an electrically conductive material such as a metal. The lines 2328a may be arranged to route electrical signals in a direction of a plane that is substantially parallel with a surface of the die substrate 2302 upon which the device layer 2304 is formed. For example, the lines 2328a may route electrical signals in a direction in and out of the page and/or in a direction across the page from the perspective of FIG. 6. The vias 2328b may be arranged to route electrical signals in a direction of a plane that is substantially perpendicular to the surface of the die substrate 2302 upon which the device layer 2304 is formed. In some embodiments, the vias 2328b may electrically couple lines 2328a of different interconnect layers 2306-2310 together.

The interconnect layers 2306-2310 may include a dielectric material 2326 disposed between the interconnect structures 2328, as shown in FIG. 23. In some embodiments, dielectric material 2326 disposed between the interconnect structures 2328 in different ones of the interconnect layers 2306-2310 may have different compositions; in other embodiments, the composition of the dielectric material 2326 between different interconnect layers 2306-2310 may be the same. The device layer 2304 may include a dielectric material 2326 disposed between the transistors 2340 and a bottom layer of the metallization stack as well. The dielectric material 2326 included in the device layer 2304 may have a different composition than the dielectric material 2326 included in the interconnect layers 2306-2310; in other embodiments, the composition of the dielectric material 2326 in the device layer 2304 may be the same as a dielectric material 2326 included in any one of the interconnect layers 2306-2310.

A first interconnect layer 2306 (referred to as Metal 1 or "M1") may be formed directly on the device layer 2304. In some embodiments, the first interconnect layer 2306 may include lines 2328a and/or vias 2328b, as shown. The lines 2328a of the first interconnect layer 2306 may be coupled with contacts (e.g., the S/D contacts 2324) of the device layer 2304. The vias 2328b of the first interconnect layer 2306 may be coupled with the lines 2328a of a second interconnect layer 2308.

The second interconnect layer 2308 (referred to as Metal 2 or "M2") may be formed directly on the first interconnect layer 2306. In some embodiments, the second interconnect layer 2308 may include via 2328b to couple the lines 2328 of the second interconnect layer 2308 with the lines 2328a of a third interconnect layer 2310. Although the lines 2328a and the vias 2328b are structurally delineated with a line within individual interconnect layers for the sake of clarity, the lines 2328a and the vias 2328b may be structurally and/or materially contiguous (e.g., simultaneously filled during a dual-damascene process) in some embodiments.

The third interconnect layer 2310 (referred to as Metal 3 or "M3") (and additional interconnect layers, as desired) may be formed in succession on the second interconnect layer 2308 according to similar techniques and configurations described in connection with the second interconnect layer 2308 or the first interconnect layer 2306. In some embodiments, the interconnect layers that are "higher up" in the metallization stack 2319 in the integrated circuit device 2300 (i.e., farther away from the device layer 2304) may be thicker that the interconnect layers that are lower in the metallization stack 2319, with lines 2328a and vias 2328b in the higher interconnect layers being thicker than those in the lower interconnect layers.

The integrated circuit device 2300 may include a solder resist material 2334 (e.g., polyimide or similar material) and one or more conductive contacts 2336 formed on the interconnect layers 2306-2310. In FIG. 23, the conductive contacts 2336 are illustrated as taking the form of bond pads. The conductive contacts 2336 may be electrically coupled with the interconnect structures 2328 and configured to route the electrical signals of the transistor(s) 2340 to external devices. For example, solder bonds may be formed on the one or more conductive contacts 2336 to mechanically and/or electrically couple an integrated circuit die including the integrated circuit device 2300 with another component (e.g., a printed circuit board). The integrated circuit device 2300 may include additional or alternate structures to route the electrical signals from the interconnect layers 2306-2310; for example, the conductive contacts 2336 may include other analogous features (e.g., posts) that route the electrical signals to external components. The conductive contacts 2336 may serve as the conductive contacts 438, etc., as appropriate.

In some embodiments in which the integrated circuit device 2300 is a double-sided die (e.g., like the die 302), the integrated circuit device 2300 may include another metallization stack (not shown) on the opposite side of the device layer(s) 2304. This metallization stack may include multiple interconnect layers as discussed above with reference to the interconnect layers 2306-2310, to provide conductive pathways (e.g., including conductive lines and vias) between the device layer(s) 2304 and additional conductive contacts (not shown) on the opposite side of the integrated circuit device 2300 from the conductive contacts 2336. These additional conductive contacts may serve as the conductive contacts 434, etc., as appropriate.

In other embodiments in which the integrated circuit device 2300 is a double-sided die (e.g., like the die 302), the integrated circuit device 2300 may include one or more through silicon vias (TSVs) through the die substrate 2302; these TSVs may make contact with the device layer(s) 2304, and may provide conductive pathways between the device layer(s) 2304 and additional conductive contacts (not shown) on the opposite side of the integrated circuit device 2300 from the conductive contacts 2336. These additional conductive contacts may serve as the conductive contacts 438, etc., as appropriate. In some embodiments, TSVs extending through the substrate can be used for routing power and ground signals from conductive contacts on the opposite side of the integrated circuit device 2300 from the conductive contacts 2336 to the transistors 2340 and any other components integrated into the die 2300, and the metallization stack 2319 can be used to route I/O signals from the conductive contacts 2336 to transistors 2340 and any other components integrated into the die 2300.

Multiple integrated circuit devices 2300 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 25:
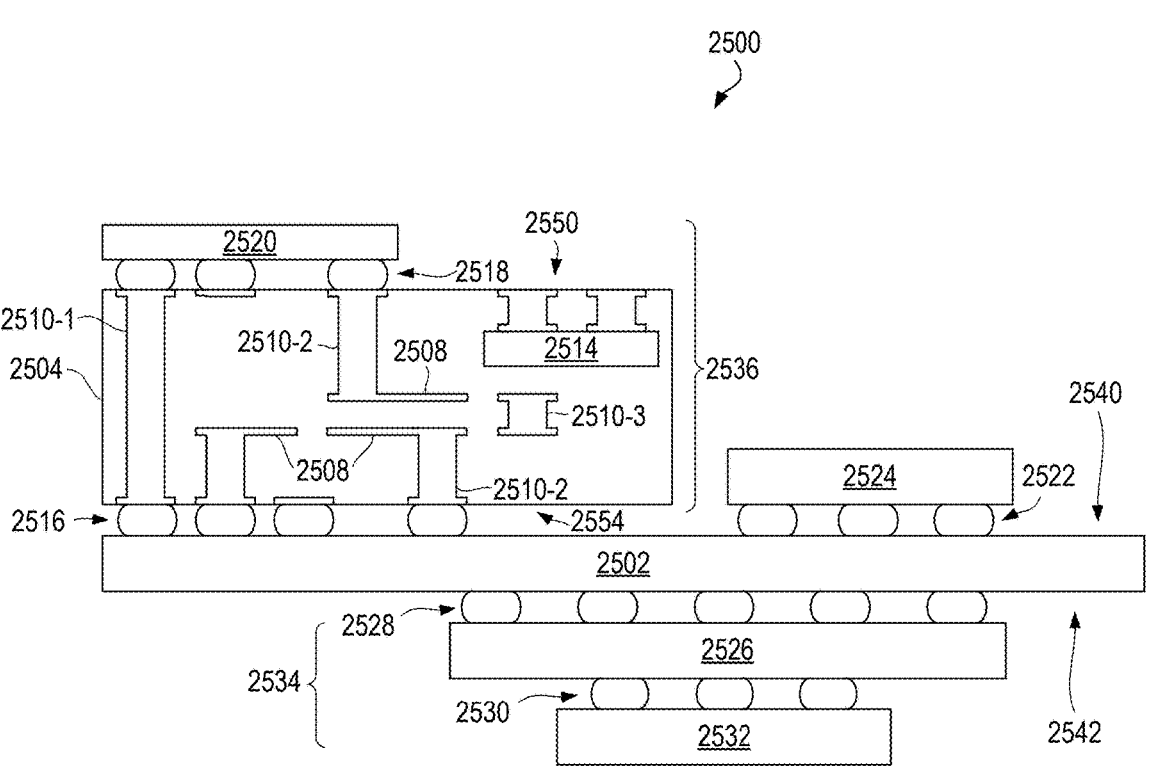
FIG. 25 is a cross-sectional side view of an integrated circuit device assembly, in accordance with any of the embodiments disclosed herein.

FIG. 25 is a cross-sectional side view of an integrated circuit device assembly 2500 that may include any of the quantum processor packages 300 disclosed herein. The integrated circuit device assembly 2500 includes a number of components disposed on a circuit board 2502 (which may be a motherboard, system board, mainboard, etc.). The integrated circuit device assembly 2500 includes components disposed on a first face 2540 of the circuit board 2502 and an opposing second face 2542 of the circuit board 2502; generally, components may be disposed on one or both faces 2540 and 2542. Any of the integrated circuit components discussed below with reference to the integrated circuit device assembly 2500 may take the form of any suitable ones of the embodiments of the quantum processor packages 300 disclosed herein.

In some embodiments, the circuit board 2502 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 2502. In other embodiments, the circuit board 2502 may be a non-PCB substrate. In some embodiments the circuit board 2502 may be, for example, the circuit board 304. The integrated circuit device assembly 2500 illustrated in FIG. 25 includes a package-on-interposer structure 2536 coupled to the first face 2540 of the circuit board 2502 by coupling components 2516. The coupling components 2516 may electrically and mechanically couple the package-on-interposer structure 2536 to the circuit board 2502, and may include solder balls (as shown in FIG. 25), pins (e.g., as part of a pin grid array (PGA)), contacts (e.g., as part of a land grid array (LGA)), male and female portions of a socket, an adhesive, an underfill material, and/or any other suitable electrical and/or mechanical coupling structure. The coupling components 2516 may serve as the coupling components illustrated or described for any of the substrate assembly or substrate assembly components described herein, as appropriate.

The package-on-interposer structure 2536 may include an integrated circuit component 2520 coupled to an interposer 2504 by coupling components 2518. The coupling components 2518 may take any suitable form for the application, such as the forms discussed above with reference to the coupling components 2516. Although a single integrated circuit component 2520 is shown in FIG. 25, multiple integrated circuit components may be coupled to the interposer 2504; indeed, additional interposers may be coupled to the interposer 2504. The interposer 2504 may provide an intervening substrate used to bridge the circuit board 2502 and the integrated circuit component 2520.

The integrated circuit component 2520 may be a packaged or unpacked integrated circuit product that includes one or more integrated circuit dies (e.g., the die 2202 of FIG. 22, the integrated circuit device 2300 of FIG. 23) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 2520, a single monolithic integrated circuit die comprises solder bumps attached to contacts on the die. The solder bumps allow the die to be directly attached to the interposer 2504. The integrated circuit component 2520 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 2520 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 2520 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 2520 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 2504 may spread connections to a wider pitch or reroute a connection to a different connection. For example, the interposer 2504 may couple the integrated circuit component 2520 to a set of ball grid array (BGA) conductive contacts of the coupling components 2516 for coupling to the circuit board 2502. In the embodiment illustrated in FIG. 25, the integrated circuit component 2520 and the circuit board 2502 are attached to opposing sides of the interposer 2504; in other embodiments, the integrated circuit component 2520 and the circuit board 2502 may be attached to a same side of the interposer 2504. In some embodiments, three or more components may be interconnected by way of the interposer 2504.

In some embodiments, the interposer 2504 may be formed as a PCB, including multiple metal layers separated from one another by layers of dielectric material and interconnected by electrically conductive vias. In some embodiments, the interposer 2504 may be formed of an epoxy resin, a fiberglass-reinforced epoxy resin, an epoxy resin with inorganic fillers, a ceramic material, or a polymer material such as polyimide. In some embodiments, the interposer 2504 may be formed of alternate rigid or flexible materials that may include the same materials described above for use in a semiconductor substrate, such as silicon, germanium, and other group III-V and group IV materials. The interposer 2504 may include metal interconnects 2508 and vias 2510, including but not limited to through hole vias 2510-1 (that extend from a first face 2550 of the interposer 2504 to a second face 2554 of the interposer 2504), blind vias 2510-2 (that extend from the first or second faces 2550 or 2554 of the interposer 2504 to an internal metal layer), and buried vias 2510-3 (that connect internal metal layers).

In some embodiments, the interposer 2504 can comprise a silicon interposer. Through silicon vias (TSV) extending through the silicon interposer can connect connections on a first face of a silicon interposer to an opposing second face of the silicon interposer. In some embodiments, an interposer 2504 comprising a silicon interposer can further comprise one or more routing layers to route connections on a first face of the interposer 2504 to an opposing second face of the interposer 2504.

The interposer 2504 may further include embedded devices 2514, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 2504. The package-on-interposer structure 2536 may take the form of any of the package-on-interposer structures known in the art.

The integrated circuit device assembly 2500 may include an integrated circuit component 2524 coupled to the first face 2540 of the circuit board 2502 by coupling components 2522. The coupling components 2522 may take the form of any of the embodiments discussed above with reference to the coupling components 2516, and the integrated circuit component 2524 may take the form of any of the embodiments discussed above with reference to the integrated circuit component 2520.

The integrated circuit device assembly 2500 illustrated in FIG. 25 includes a package-on-package structure 2534 coupled to the second face 2542 of the circuit board 2502 by coupling components 2528. The package-on-package structure 2534 may include an integrated circuit component 2526 and an integrated circuit component 2532 coupled together by coupling components 2530 such that the integrated circuit component 2526 is disposed between the circuit board 2502 and the integrated circuit component 2532. The coupling components 2528 and 2530 may take the form of any of the embodiments of the coupling components 2516 discussed above, and the integrated circuit components 2526 and 2532 may take the form of any of the embodiments of the integrated circuit component 2520 discussed above. The package-on-package structure 2534 may be configured in accordance with any of the package-on-package structures known in the art.

FIG. 26 is a block diagram of an example electrical device 2600 that may include one or more of the quantum processor packages 300 disclosed herein. For example, any suitable ones of the components of the electrical device 2600 may include one or more of the integrated circuit device assemblies 2500, integrated circuit components 2520, integrated circuit devices 2300, or integrated circuit dies 2202 disclosed herein, and may be arranged in any of the quantum processor packages 300 disclosed herein. A number of components are illustrated in FIG. 26 as included in the electrical device 2600, but any one or more of these components may be omitted or duplicated, as suitable for the application. In some embodiments, some or all of the components included in the electrical device 2600 may be attached to one or more motherboards mainboards, or system boards. In some embodiments, one or more of these components are fabricated onto a single system-on-a-chip (SoC) die.

Additionally, in various embodiments, the electrical device 2600 may not include one or more of the components illustrated in FIG. 26, but the electrical device 2600 may include interface circuitry for coupling to the one or more components. For example, the electrical device 2600 may not include a display device 2606, but may include display device interface circuitry (e.g., a connector and driver circuitry) to which a display device 2606 may be coupled. In another set of examples, the electrical device 2600 may not include an audio input device 2624 or an audio output device 2608, but may include audio input or output device interface circuitry (e.g., connectors and supporting circuitry) to which an audio input device 2624 or audio output device 2608 may be coupled.

The electrical device 2600 may include one or more processor units 2602 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 2602 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 2600 may include a memory 2604, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 2604 may include memory that is located on the same integrated circuit die as the processor unit 2602. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 2600 can comprise one or more processor units 2602 that are heterogeneous or asymmetric to another processor unit 2602 in the electrical device 2600. There can be a variety of differences between the processing units 2602 in a system in terms of a spectrum of metrics of merit including architectural, micro-architectural, thermal, power consumption characteristics, and the like. These differences can effectively manifest themselves as asymmetry and heterogeneity among the processor units 2602 in the electrical device 2600.

In some embodiments, the electrical device 2600 may include a communication component 2612 (e.g., one or more communication components). For example, the communication component 2612 can manage wireless communications for the transfer of data to and from the electrical device 2600. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 2612 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 2612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 2612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 2612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 2612 may operate in accordance with other wireless protocols in other embodiments. The electrical device 2600 may include an antenna 2622 to facilitate wireless communications and/or to receive other wireless communications (such as AM or FM radio transmissions).

In some embodiments, the communication component 2612 may manage wired communications, such as electrical, optical, or any other suitable communication protocols (e.g., IEEE 802.3 Ethernet standards). As noted above, the communication component 2612 may include multiple communication components. For instance, a first communication component 2612 may be dedicated to shorter-range wireless communications such as Wi-Fi or Bluetooth, and a second communication component 2612 may be dedicated to longer-range wireless communications such as global positioning system (GPS), EDGE, GPRS, CDMA, WiMAX, LTE, EV-DO, or others. In some embodiments, a first communication component 2612 may be dedicated to wireless communications, and a second communication component 2612 may be dedicated to wired communications.

The electrical device 2600 may include battery/power circuitry 2614. The battery/power circuitry 2614 may include one or more energy storage devices (e.g., batteries or capacitors) and/or circuitry for coupling components of the electrical device 2600 to an energy source separate from the electrical device 2600 (e.g., AC line power).

The electrical device 2600 may include a display device 2606 (or corresponding interface circuitry, as discussed above). The display device 2606 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 2600 may include an audio output device 2608 (or corresponding interface circuitry, as discussed above). The audio output device 2608 may include any embedded or wired or wirelessly connected external device that generates an audible indicator, such as speakers, headsets, or earbuds.

The electrical device 2600 may include an audio input device 2624 (or corresponding interface circuitry, as discussed above). The audio input device 2624 may include any embedded or wired or wirelessly connected device that generates a signal representative of a sound, such as microphones, microphone arrays, or digital instruments (e.g., instruments having a musical instrument digital interface (MIDI) output). The electrical device 2600 may include a Global Navigation Satellite System (GNSS) device 2618 (or corresponding interface circuitry, as discussed above), such as a Global Positioning System (GPS) device. The GNSS device 2618 may be in communication with a satellite-based system and may determine a geolocation of the electrical device 2600 based on information received from one or more GNSS satellites, as known in the art.

The electrical device 2600 may include an other output device 2610 (or corresponding interface circuitry, as discussed above). Examples of the other output device 2610 may include an audio codec, a video codec, a printer, a wired or wireless transmitter for providing information to other devices, or an additional storage device.

The electrical device 2600 may include an other input device 2620 (or corresponding interface circuitry, as discussed above). Examples of the other input device 2620 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 2600 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 2600 may be any other electronic device that processes data. In some embodiments, the electrical device 2600 may comprise multiple discrete physical components. Given the range of devices that the electrical device 2600 can be manifested as in various embodiments, in some embodiments, the electrical device 2600 can be referred to as a computing device or a computing system.

EXAMPLES

Illustrative examples of the technologies disclosed herein are provided below. An embodiment of the technologies may include any one or more, and any combination of, the examples described below.

Example 1 includes a quantum processor die comprising a stack comprising a plurality of semiconductor layers, the plurality of semiconductor layers defining a quantum well in the stack; a first plurality of traces positioned above the stack; and a second plurality of traces positioned below the stack, wherein, in response to applied voltages or currents or both, the first plurality of traces and the second plurality of traces are to define a plurality of spin qubits in the stack.

Example 2 includes the subject matter of Example 1, and wherein, in response to applied voltages, the first plurality of traces and the second plurality of traces are to define a potential for the plurality of spin qubits in the stack.

Example 3 includes the subject matter of any of Examples 1 and 2, and wherein, in response to applied voltages, the first plurality of traces are to apply a static electric field to the stack to at least partially define a potential for the plurality of spin qubits in the stack, wherein, in response to applied currents, the second plurality of traces are to apply a static magnetic field to the stack to at least partially define a potential for the plurality of spin qubits in the stack.

Example 4 includes the subject matter of any of Examples 1-3, and wherein, in response to applied voltages, the first plurality of traces are to apply a static electric field to the stack to at least partially define a potential for the plurality of spin qubits in the stack, wherein, in response to applied voltages, the second plurality of traces are to tune a valley splitting of one or more of the plurality of spin qubits.

Example 5 includes the subject matter of any of Examples 1-4, and wherein, in response to applied voltages, the first plurality of traces and the second plurality of traces are to apply a static electric field to the stack to at least partially define a potential for the plurality of spin qubits in the stack.

Example 6 includes the subject matter of any of Examples 1-5, and wherein, in response to applied voltages, the first plurality of traces are to apply a static electric field to the stack to at least partially define a potential for the plurality of spin qubits in the stack, wherein, in response to applied voltages or currents or both, the second plurality of traces are to tune a resonance frequency of individual spin qubits of the plurality of spin qubits to make individual spin qubits of the plurality of spin qubits individually addressable.

Example 7 includes the subject matter of any of Examples 1-6, and wherein, in response to applied voltages, the first plurality of traces are to apply a static electric field to the stack to at least partially define a potential for the plurality of spin qubits in the stack, wherein, in response to applied voltages or currents or both, the second plurality of traces are to perform an operation on one or more of the plurality of spin qubits by application of microwave pulses.

Example 8 includes the subject matter of any of Examples 1-7, and wherein the plurality of spin qubits are positioned along a first axis, wherein individual traces of the second plurality of traces extend along a second axis perpendicular to the first axis.

Example 9 includes a system comprising the quantum processor of Example 8 and quantum/classical interface circuitry, wherein, in use, the quantum/classical interface circuitry is to control current passing through the second plurality of traces to apply magnetic fields to the plurality of spin qubits.

Example 10 includes the subject matter of Example 9, and wherein there is a first distance between the plurality of spin qubits and a nearest trace above the stack and a second distance between the plurality of spin qubits and a nearest trace below the stack, wherein the second distance is at least 20% more or less than the first distance.

Example 11 includes the subject matter of any of Examples 9 and 10, and wherein individual traces of the second plurality of traces have a superconducting transition temperature below an operating temperature of the quantum processor die.

Example 12 includes the subject matter of any of Examples 9-11, and wherein individual traces of the second plurality of traces comprise niobium.

Example 13 includes the subject matter of any of Examples 9-12, and wherein individual traces of the first plurality of traces and second plurality of traces comprise niobium, tungsten, or titanium.

Example 14 includes the subject matter of any of Examples 9-13, and wherein the stack comprises a first layer comprising silicon and germanium; a second layer adjacent the first layer, the second layer comprising silicon; and a third layer adjacent the second layer, the third layer comprising silicon and germanium.

Example 15 includes a quantum computer comprising the quantum processor die of Example 1, further comprising quantum/classical interface circuitry coupled to the quantum processor die; and a processor coupled to the quantum/classical interface circuitry.

Example 16 includes a quantum processor die comprising a stack comprising a first layer comprising silicon and germanium; a second layer adjacent the first layer, the second layer comprising silicon; a third layer adjacent the second layer, the third layer comprising silicon and germanium; a first plurality of traces positioned above the stack, wherein traces of the first plurality of traces are positioned less than one micrometer from the second layer; and a second plurality of traces positioned below the stack, wherein traces of the second plurality of traces positioned less than one micrometer from the second layer.

Example 17 includes the subject matter of Example 16, and wherein, in response to applied voltages, the first plurality of traces and the second plurality of traces are to define a potential for a plurality of spin qubits in the stack.

Example 18 includes the subject matter of any of Examples 16 and 17, and wherein, in response to applied voltages, the first plurality of traces are to apply a static electric field to the stack to at least partially define a potential for a plurality of spin qubits in the stack, wherein, in response to applied currents, the second plurality of traces are to apply a static magnetic field to the stack to at least partially define a potential for a plurality of spin qubits in the stack.

Example 19 includes the subject matter of any of Examples 16-18, and wherein, in response to applied voltages, the first plurality of traces are to apply a static electric field to the stack to at least partially define a potential for a plurality of spin qubits in the stack, wherein, in response to applied voltages, the second plurality of traces are to tune a valley splitting of one or more of the plurality of spin qubits.

Example 20 includes the subject matter of any of Examples 16-19, and wherein, in response to applied voltages, the first plurality of traces and the second plurality of traces are to apply a static electric field to the stack to at least partially define a potential for a plurality of spin qubits in the stack.

Example 21 includes the subject matter of any of Examples 16-20, and wherein, in response to applied voltages, the first plurality of traces are to apply a static electric field to the stack to at least partially define a potential for a plurality of spin qubits in the stack, wherein, in response to applied voltages or currents or both, the second plurality of traces are to tune a resonance frequency of individual spin qubits of the plurality of spin qubits to make individual spin qubits of the plurality of spin qubits individually addressable.

Example 22 includes the subject matter of any of Examples 16-21, and wherein, in response to applied voltages, the first plurality of traces are to apply a static electric field to the stack to at least partially define a potential for a plurality of spin qubits in the stack, wherein, in response to applied voltages or currents or both, the second plurality of traces are to perform an operation on one or more of the plurality of spin qubits by application of microwave pulses.

Example 23 includes the subject matter of any of Examples 16-22, and wherein, in response to applied voltages or currents or both, the first plurality of traces and the second plurality of traces are to define a plurality of spin qubits in the stack.

Example 24 includes the subject matter of any of Examples 16-23, and wherein a plurality of spin qubits are positioned along a first axis, wherein individual traces of the second plurality of traces extend along a second axis perpendicular to the first axis.

Example 25 includes a system comprising the quantum processor of Example 24 and quantum/classical interface circuitry, wherein, in use, the quantum/classical interface circuitry is to control current passing through the second plurality of traces to apply magnetic fields to the plurality of spin qubits.

Example 26 includes the subject matter of Example 25, and wherein there is a first distance between the plurality of spin qubits and a nearest trace above the stack and a second distance between the plurality of spin qubits and a nearest trace below the stack, wherein the second distance is at least 20% more or less than the first distance.

Example 27 includes the subject matter of any of Examples 25 and 26, and wherein individual traces of the second plurality of traces have a superconducting transition temperature below an operating temperature of the quantum processor die.

Example 28 includes the subject matter of any of Examples 25-27, and wherein individual traces of the second plurality of traces comprise niobium.

Example 29 includes the subject matter of any of Examples 25-28, and wherein individual traces of the first plurality of traces and second plurality of traces comprise niobium, tungsten, or titanium.

Example 30 includes a quantum computer comprising the quantum processor die of Example 16, further comprising quantum/classical interface circuitry coupled to the quantum processor die; and a processor coupled to the quantum/classical interface circuitry.

Example 31 includes a method comprising forming a stack on a wafer, the stack comprising a first layer comprising silicon and germanium, a second layer adjacent the first layer comprising silicon, and a third layer adjacent the second layer comprising silicon and germanium; forming a first plurality of traces above the stack after forming the stack; and forming a second plurality of traces below the stack after forming the first plurality of traces.

Example 32 includes the subject matter of Example 31, and further including flipping the wafer after forming the first plurality of traces and before forming the second plurality of traces.

Example 33 includes the subject matter of any of Examples 31 and 32, and wherein forming the stack on the wafer comprises forming the stack on a substrate of the wafer, wherein forming the second plurality of traces comprises removing at least part of the substrate to form a surface a predetermined distance away from the stack.

Example 34 includes the subject matter of any of Examples 31-33, and wherein forming the second plurality of traces comprises forming the second plurality of traces using layer transfer.

Example 35 includes the subject matter of any of Examples 31-34, and further including forming a via that extends from the first plurality of traces through the stack.

The invention claimed is:

1. A quantum processor die comprising:
a stack comprising a plurality of semiconductor layers, the plurality of semiconductor layers defining a quantum well in the stack;
a first plurality of traces positioned above the stack; and
a second plurality of traces positioned below the stack,
wherein, in response to applied voltages or currents or both, the first plurality of traces and the second plurality of traces are to define a plurality of spin qubits in the stack,
wherein, in response to applied voltages, the first plurality of traces are to apply a static electric field to the stack to at least partially define a potential for the plurality of spin qubits in the stack,
wherein, in response to applied voltages, the second plurality of traces are to tune a valley splitting of one or more of the plurality of spin qubits.

2. The quantum processor die of claim 1, wherein, in response to applied voltages, the first plurality of traces and the second plurality of traces are to define a potential for the plurality of spin qubits in the stack.

3. The quantum processor die of claim 1, wherein, in response to applied voltages, the first plurality of traces are to apply a static electric field to the stack to at least partially define a potential for the plurality of spin qubits in the stack,
wherein, in response to applied currents, the second plurality of traces are to apply a static magnetic field to the stack to at least partially define a potential for the plurality of spin qubits in the stack.

4. The quantum processor die of claim 1, wherein, in response to applied voltages, the first plurality of traces are to apply a static electric field to the stack to at least partially define a potential for the plurality of spin qubits in the stack,
wherein, in response to applied voltages or currents or both, the second plurality of traces are to tune a resonance frequency of individual spin qubits of the plurality of spin qubits to make individual spin qubits of the plurality of spin qubits individually addressable.

5. The quantum processor die of claim 1, wherein, in response to applied voltages, the first plurality of traces are to apply a static electric field to the stack to at least partially define a potential for the plurality of spin qubits in the stack,
wherein, in response to applied voltages or currents or both, the second plurality of traces are to perform an operation on one or more of the plurality of spin qubits by application of microwave pulses.

6. The quantum processor die of claim 1, wherein the plurality of spin qubits are positioned along a first axis, wherein individual traces of the second plurality of traces extend along a second axis perpendicular to the first axis.

7. A system comprising the quantum processor die of claim 6 and quantum/classical interface circuitry, wherein, in use, the quantum/classical interface circuitry is to control current passing through the second plurality of traces to apply magnetic fields to the plurality of spin qubits.

8. The quantum processor die of claim 1, wherein there is a first distance between the plurality of spin qubits and a nearest trace above the stack and a second distance between the plurality of spin qubits and a nearest trace below the stack, wherein the second distance is at least 20% more or less than the first distance.

9. The quantum processor die of claim 1, wherein individual traces of the second plurality of traces have a superconducting transition temperature below an operating temperature of the quantum processor die.

10. The quantum processor die of claim 9, wherein individual traces of the second plurality of traces comprise niobium.

11. The quantum processor die of claim 1, wherein the stack comprises:
a first layer comprising silicon and germanium;
a second layer adjacent the first layer, the second layer comprising silicon; and
a third layer adjacent the second layer, the third layer comprising silicon and germanium.

12. A quantum processor die comprising:
a stack comprising:
a first layer comprising silicon and germanium;
a second layer adjacent the first layer, the second layer comprising silicon;
a third layer adjacent the second layer, the third layer comprising silicon and germanium;
a first plurality of traces positioned above the stack, wherein traces of the first plurality of traces are positioned less than one micrometer from the second layer; and
a second plurality of traces positioned below the stack, wherein traces of the second plurality of traces are positioned less than one micrometer from the second layer,
wherein, in response to applied voltages or currents or both, the first plurality of traces and the second plurality of traces are to define a plurality of spin qubits in the stack,
wherein there is a first distance between the plurality of spin qubits and a nearest trace above the stack and a second distance between the plurality of spin qubits and a nearest trace below the stack, wherein the second distance is at least 20% more or less than the first distance.

13. The quantum processor die of claim 12, wherein individual traces of the second plurality of traces have a superconducting transition temperature below an operating temperature of the quantum processor die.

14. The quantum processor die of claim 13, wherein individual traces of the second plurality of traces comprise niobium.

15. A method comprising:
forming a stack on a wafer, the stack comprising a first layer comprising silicon and germanium, a second layer adjacent the first layer comprising silicon, and a third layer adjacent the second layer comprising silicon and germanium;
forming a first plurality of traces above the stack after forming the stack; and
forming a second plurality of traces below the stack after forming the first plurality of traces,
wherein, in response to applied voltages or currents or both, the first plurality of traces and the second plurality of traces are to define a plurality of spin qubits in the stack,
wherein there is a first distance between the plurality of spin qubits and a nearest trace above the stack and a second distance between the plurality of spin qubits and a nearest trace below the stack, wherein the second distance is at least 20% more or less than the first distance.

16. The method of claim 15, further comprising flipping the wafer after forming the first plurality of traces and before forming the second plurality of traces.

17. The method of claim 15, wherein forming the second plurality of traces comprises forming the second plurality of traces using layer transfer.

* * * * *